(12) United States Patent
Liu et al.

(10) Patent No.: US 8,488,365 B2
(45) Date of Patent: Jul. 16, 2013

(54) MEMORY CELLS

(75) Inventors: Jun Liu, Boise, ID (US); Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 212 days.

(21) Appl. No.: 13/034,031

(22) Filed: Feb. 24, 2011

(65) Prior Publication Data

US 2012/0218806 A1 Aug. 30, 2012

(51) Int. Cl.
*G11C 11/00* (2006.01)

(52) U.S. Cl.
USPC .......................................... 365/148; 365/129

(58) Field of Classification Search
USPC ............. 365/46, 94, 100, 129, 148, 158, 163; 257/2–5, 9, 310, E21.35; 438/95, 96, 135, 438/166, 240, 365, 482, 486, 597, 785
See application file for complete search history.

(56) References Cited

U.S. PATENT DOCUMENTS

| | | | |
|---|---|---|---|
| 6,524,867 B2 | 2/2003 | Yang et al. | |
| 7,273,791 B2 | 9/2007 | Basceri et al. | |
| 7,393,785 B2 | 7/2008 | Uhlenbrock et al. | |
| 7,544,987 B2 | 6/2009 | Lu et al. | |
| 7,560,815 B1 | 7/2009 | Vaartstra et al. | |
| 7,639,523 B2 | 12/2009 | Celinska et al. | |
| 7,727,908 B2 | 6/2010 | Ahn et al. | |
| 2006/0215445 A1* | 9/2006 | Baek et al. | 365/158 |
| 2007/0010082 A1 | 1/2007 | Pinnow et al. | |
| 2007/0269683 A1 | 11/2007 | Chen et al. | |
| 2008/0106925 A1* | 5/2008 | Paz de Araujo et al. | 365/148 |
| 2009/0207647 A1 | 8/2009 | Maejima et al. | |
| 2009/0272959 A1* | 11/2009 | Phatak et al. | 257/2 |
| 2009/0272961 A1* | 11/2009 | Miller et al. | 257/4 |
| 2009/0272962 A1* | 11/2009 | Kumar et al. | 257/4 |
| 2009/0273087 A1* | 11/2009 | French et al. | 257/761 |
| 2009/0278109 A1* | 11/2009 | Phatak | 257/4 |
| 2010/0044666 A1* | 2/2010 | Baek et al. | 257/2 |
| 2010/0237442 A1 | 9/2010 | Li et al. | |
| 2010/0243983 A1* | 9/2010 | Chiang et al. | 257/4 |
| 2010/0258782 A1* | 10/2010 | Kuse et al. | 257/4 |

FOREIGN PATENT DOCUMENTS

| | | |
|---|---|---|
| JP | 2008-192995 | 8/2008 |
| KR | 2007/0111840 | 11/2007 |
| KR | 2007/0118865 | 12/2007 |
| KR | 10-2010-0078808 | 7/2010 |
| WO | WO 2009/127187 | 10/2009 |

OTHER PUBLICATIONS

WO PCT/US2012/021168, Jul. 25, 2012, Written Opinion.
WO PCT/US2012/021168, Jul. 25, 2012, Search Report.
Choi et al., "Defect Structure and Electrical Properties of Single-Crystal Ba0.03Sr0.97TiO3". Journal of American Ceramics Society, 71(4), pp. 201-205, 1988.

* cited by examiner

*Primary Examiner* — Richard Elms
*Assistant Examiner* — Harry W Byrne
(74) *Attorney, Agent, or Firm* — Wells St. John P.S.

(57) ABSTRACT

Some embodiments include methods in which a memory cell is formed to have programmable material between first and second access lines, with the programmable material having two compositionally different regions. A concentration of ions and/or ion-vacancies may be altered in at least one of the regions to change a memory state of the memory cell and to simultaneously form a pn diode. Some embodiments include memory cells having programmable material with two compositionally different regions, and having ions and/or ion-vacancies diffusible into at least one of the regions. The memory cell has a memory state in which the first and second regions are of opposite conductivity type relative to one another.

12 Claims, 19 Drawing Sheets

MEMORY CELLS

TECHNICAL FIELD

Memory cells, methods of forming memory cells, and methods of programming memory cells.

BACKGROUND

Memory is one type of integrated circuitry, and is used in computer systems for storing data. Integrated memory is usually fabricated in one or more arrays of individual memory cells. The memory cells may be volatile, semi-volatile, or nonvolatile. Nonvolatile memory cells can store data for extended periods of time, and in some instances can store data in the absence of power. Volatile memory dissipates and is therefore refreshed/rewritten to maintain data storage.

The memory cells are configured to retain or store memory in at least two different selectable states. In a binary system, the states are considered as either a "0" or a "1". In other systems, at least some individual memory cells may be configured to store more than two levels or states of information.

There is a continuing effort to produce smaller and denser integrated circuits. The smallest and simplest memory cell will likely be comprised of two electrically conductive electrodes having a programmable material received between them. Such memory cells may be referred to as cross-point memory cells.

Programmable materials suitable for utilization in cross-point memory will have two or more selectable and electrically differentiable memory states. The multiple selectable memory states can enable storing of information by an individual memory cell. The reading of the cell comprises determination of which of the memory states the programmable material is in, and the writing of information to the cell comprises placing the programmable material in a predetermined memory state. Some programmable materials retain a memory state in the absence of refresh, and thus may be incorporated into nonvolatile memory cells.

Significant interest is presently being directed toward programmable materials that utilize ions as mobile charge carriers. The programmable materials may be converted from one memory state to another by moving the mobile charge carriers therein to alter a distribution of charge density within the programmable materials. Memory devices that utilize migration of mobile charge carriers to transition from one memory state to another are sometimes referred to as Resistive Random Access Memory (RRAM) cells.

A difficulty in utilizing memory cells that simply consist of programmable material received between a pair of electrodes (i.e., cross-point memory cells) is that there can be substantial leakage of current through the devices, and such may adversely lead to errors during retrieval of stored data from a memory array. Accordingly, diodes or other select devices are commonly paired with the memory cells to assist in control of current through the memory cells. The select devices consume valuable space, and accordingly it would be desirable to develop memory cells which could perform suitably without adjacent select devices.

DETAILED DESCRIPTION OF THE ILLUSTRATED EMBODIMENTS

In some embodiments, the invention includes memory cells which are programmed by altering a concentration of ions within at least one region of a programmable material. The memory cells may be further configured so that a pn diode forms within the programmable material simultaneously with a transition of the programmable material into a high-conductivity (i.e., low-resistance) memory state. Accordingly, the memory cells may have a pn diode intrinsically formed within a programmable material as the programmable material transitions into a high-conductivity memory state.

As discussed above in the "Background" section of this disclosure, a problem associated with prior art cross-point memory architectures can be that such architectures have select devices external of the memory cells, and paired with each of the memory cells, which increases the space consumed by such architectures. In contrast, some embodiments of the present invention may have a diode intrinsically formed within the programmable material, and may utilize such diode in place of the conventional select devices that would otherwise be formed externally of the memory cell. Such may enable higher integration density to be achieved than is achieved with prior art memory cells.

Figure 1:
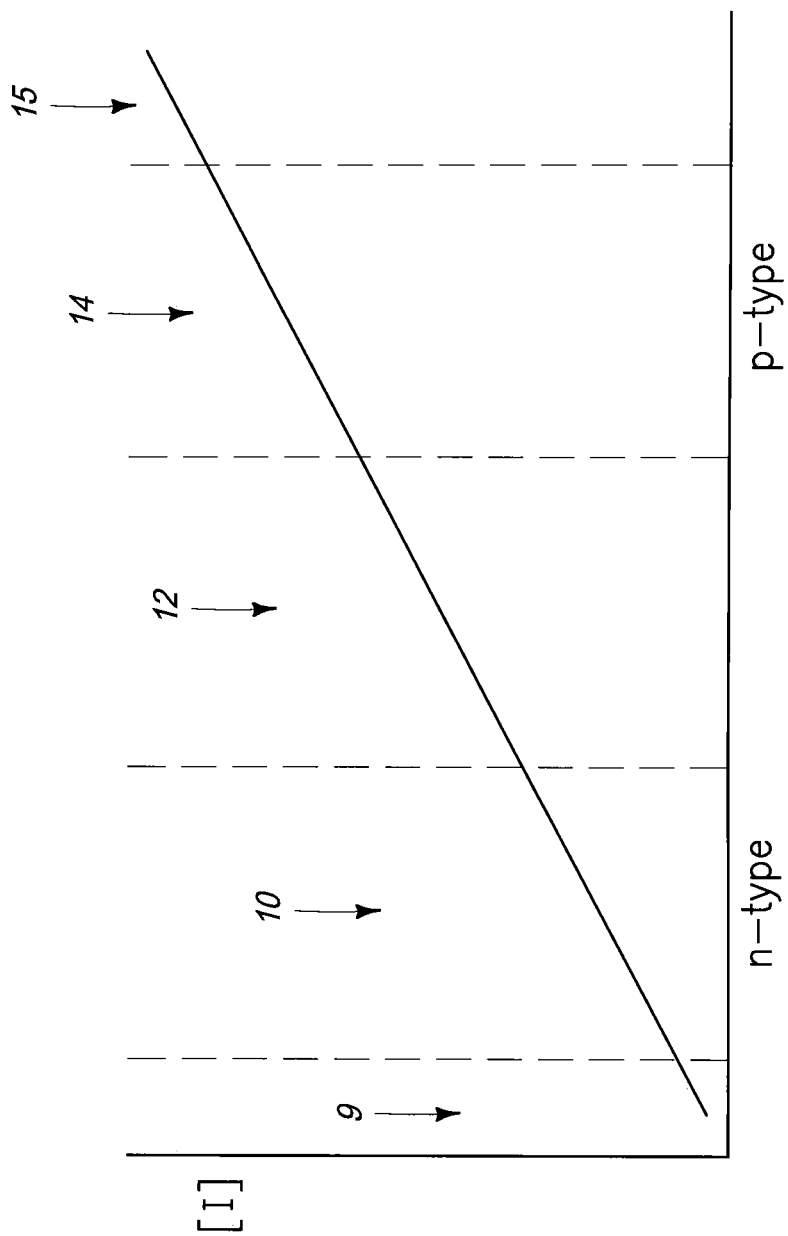
FIGS. 1-3 are graphical, diagrammatic illustrations of the effect of ion concentration on the conductivity type of some materials.

Some systems are known in which ions may be utilized to induce a conductivity type (specifically, n-type or p-type). FIG. 1 graphically illustrates a system in which a conductivity type is influenced by the concentration of ions (represented as [I]). Specifically, at some ion concentrations the system is in a regime 10 having n-type characteristics, and at other ion concentrations the system is in a regime 14 having p-type characteristics. An intermediate regime 12 is between the regimes 10 and 14, and in such intermediate regime the system may have characteristics which are indeterminate relative to n-type and p-type, or may have other electrical characteristics (such as electrically insulative characteristics), depending on the system.

The system of FIG. 1 is also shown comprising a regime 9 in which the concentration of ions is less than that suitable to induce n-type characteristics, as well as a regime 15 in which the concentration of ions is greater than that which induces p-type characteristics. Either of the regimes 9 and 15 may have conventional electrically insulative characteristics, or conventional electrically conductive characteristics, depending on the system.

Figure 2:
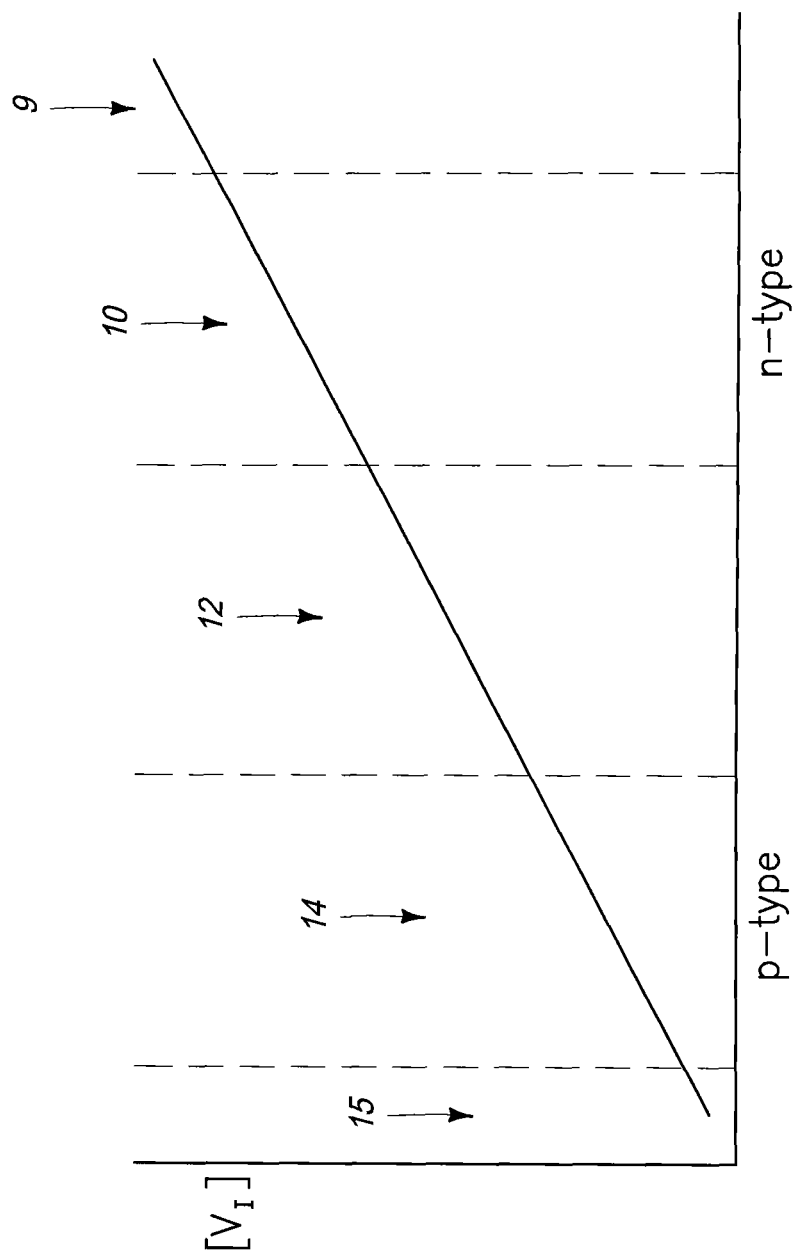

FIG. 2 illustrates the same system as FIG. 1, but shown with an alternative convention relative to that of FIG. 1. Specifically, FIG. 2 shows the conductivity type of the system being influenced by the concentration of ion vacancies (represented as $[V_I]$). The concentration of ion vacancies may be roughly inverse to the concentration of ions. Accordingly, FIG. 2 shows the same regions 9, 10, 12, 14 and 15 as FIG. 1, but shows such regions having an inverse relationship relative to the relationship illustrated in FIG. 1. The "vacancies" are typically not empty spaces, but rather are regions where ions could be present, and are not. Such regions may have any of numerous configurations, but are real physical moieties that can have measurable mobility within a system.

A distribution of ions within a material may be described as either the concentration of the ions themselves, or as the concentration of vacancies of the ions. The vacancies will typically have an opposite charge to the ions themselves. In some contexts it is conventional to refer to positively-charged species in a system. In such contexts, it will be the charge which will determine whether a system is described in terms of vacancy concentration or ion concentration. For instance, since oxygen-containing ions typically have a negative charge, it may be preferred to describe the charged species of an oxygen-based system as vacancies in some contexts.

Although the concentration of ion vacancies is sometimes considered as the inverse of the concentrations of ions, there may not be a simple correlation between the concentration of ions and the concentration of ion vacancies in some systems. For instance, there may be differences between ion mobility and ion vacancy mobility which leads to faster accumulation of either ions or vacancies, and thus leads to imbalance between a rate of change in ion concentration relative to a rate of change of ion vacancy concentration. Accordingly, many of the systems described herein may be considered to utilize alteration of either or both of ion concentration and ion vacancy concentration to achieve desired changes within the systems.

Figure 3:
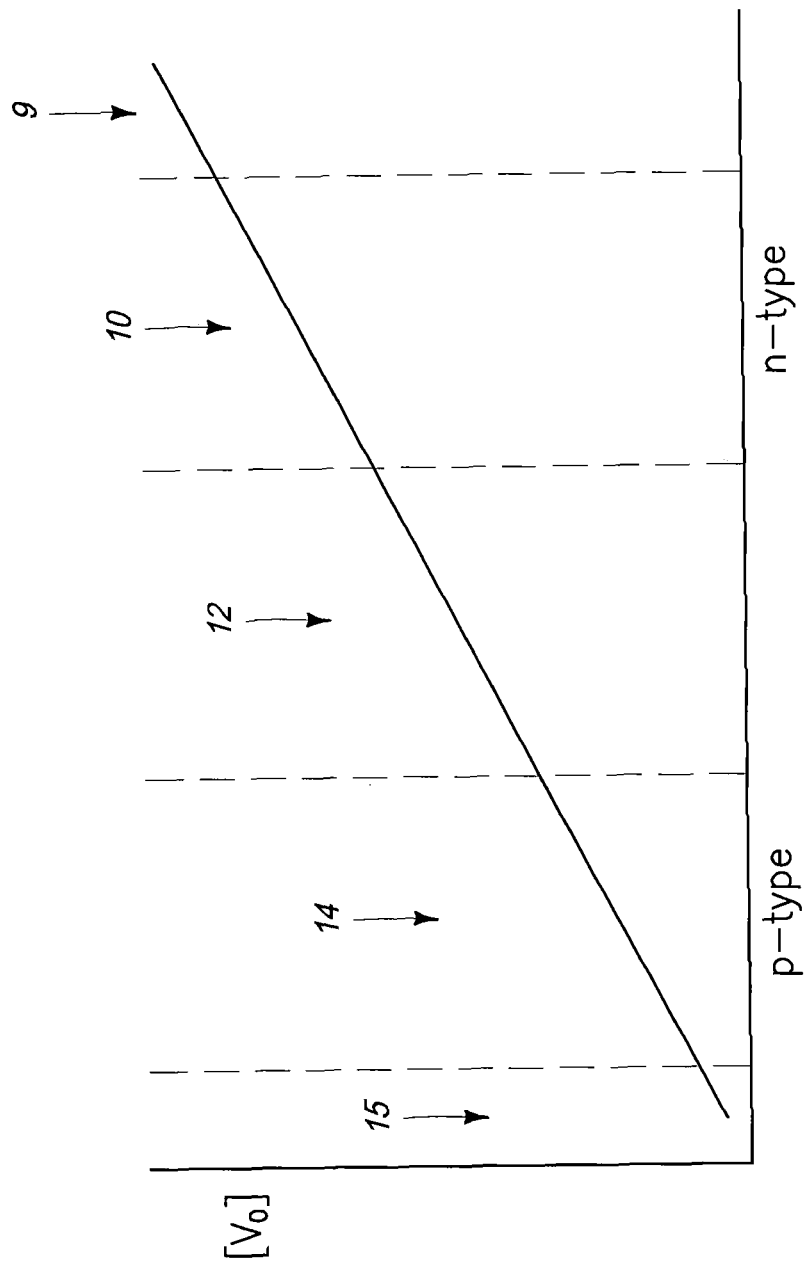

FIG. 3 graphically illustrates an oxygen-based system, or, more specifically, a system in which conductivity type is influenced by a concentration of oxygen-containing ions. The concentration of oxygen atoms is approximated in FIG. 3 by the concentration of oxygen-containing ion vacancies ($V_O$). The system has the same regimes 9, 10, 12, 14 and 15 discussed above with reference to FIGS. 1 and 2. The system of FIG. 3 may contain oxygen ions distributed within a composition that comprises oxygen in combination with one or more of praseodymium, barium, calcium, manganese, strontium, titanium, iron, cesium and lead. For instance, the composition may comprise one or more of PrCaMnO, BaSrTiO, SrTiO, SrCeFeO, and PbO, where such compositions are shown in terms of the elements contained therein, rather than in terms of a specific stoichiometry. In some embodiments, the composition shown as PrCaMnO may correspond to $Pr_{(1-x)}Ca_xMnO_3$, where x is any number greater than 0 and less than 1.

Oxygen-based systems may be highly sensitive to the concentration of oxygen-containing ions (and/or to the concentration of vacancies of oxygen-containing ions). For instance, a change in the concentration of oxygen ions of about 10 parts per million may shift SrTiO from the regime 10 having n-type characteristics to the regime 14 having p-type characteristics.

The oxygen-based systems represented by FIG. 3 may be considered to correspond to valence change material systems. Specifically, the systems comprise materials having one or more elements with multiple stable valence states (for instance, titanium, iron, manganese, etc.). Valence change systems are example systems that may be utilized in some embodiments. Valance change systems may comprise mobile ions, and/or mobile ion vacancies, that can be moved within the systems to alter ion and ion vacancy concentrations throughout the systems. Mobile ions and mobile ion vacancies may or may not coexist in a single system, depending on the system. Thus, one or both of the mobile species corresponding to mobile ions and mobile ion vacancies may be utilized to alter ion concentration, and/or ion vacancy concentration, within a given system.

Oxygen-based systems of the type represented in FIG. 3 are examples of the types of systems that may be utilized in various embodiments of the invention. Any suitable systems may be utilized, and other example systems are sulfur-based systems, nitrogen-based systems, etc.

The curves of FIGS. 1-3 are qualitative representations of the relationship between ion concentration (and/or ion vacancy concentration) and conductivity type for various systems. The concept being illustrated is that the conductivity type of some systems may be influenced and changed by an ion concentration (and/or an ion vacancy concentration) within such systems. Actual systems may have a different relationship between the ion concentration (and/or the ion vacancy concentration) and the conductivity type besides the simple linear curves of FIGS. 1-3. However, as long as an ion concentration (and/or the ion vacancy concentration) within a system can influence and alter the conductivity type of the system, such system may be suitable for incorporation into the programmable material of memory cells in various aspects of the present invention.

Figure 4:
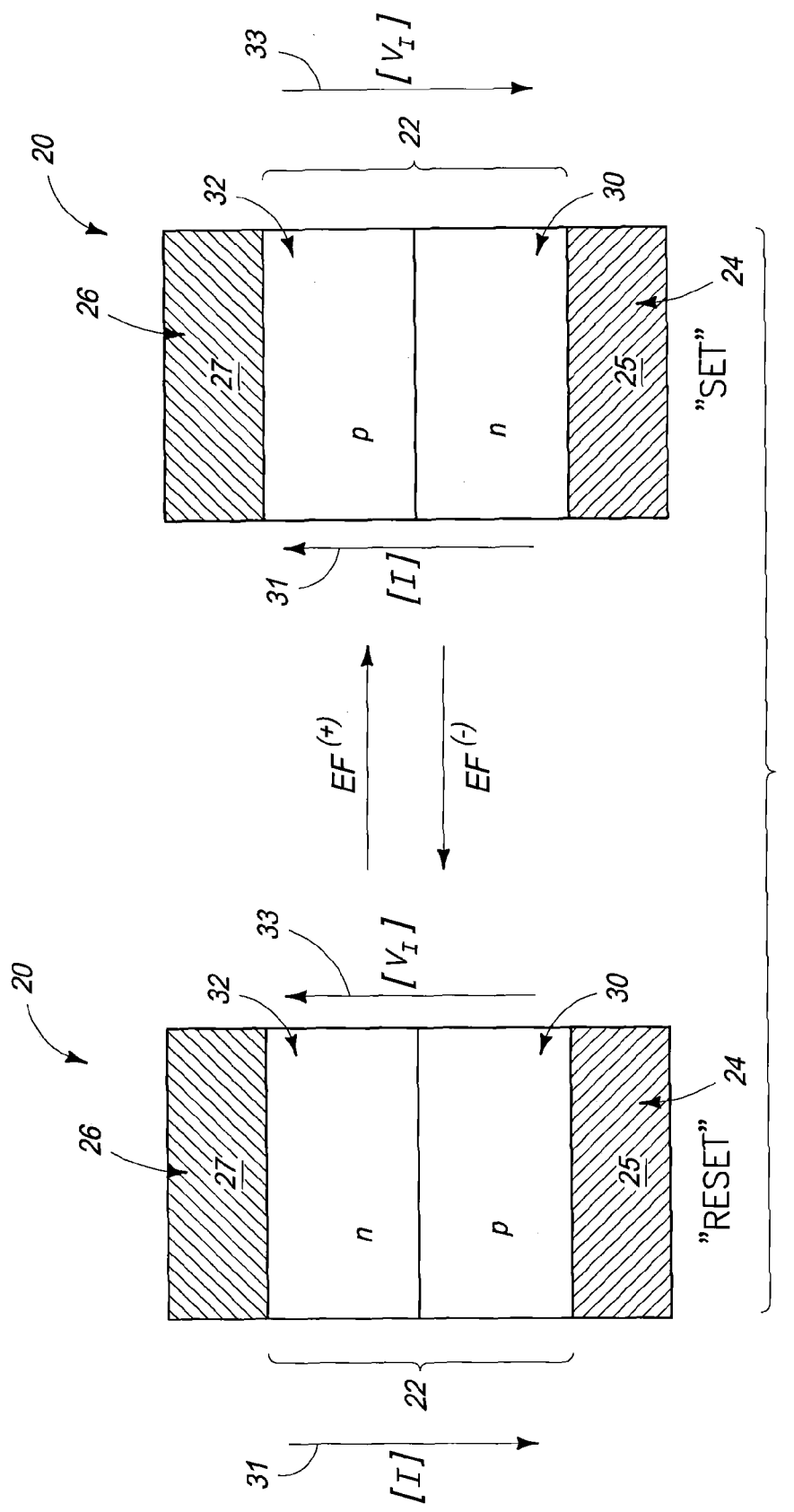
FIG. 4 shows diagrammatic views of an example embodiment memory cell in a first memory state (a "RESET" state) and a second memory state (a "SET" state), with such memory states being shown to be interchangeable through application of electric field (EF).

FIG. 4 illustrates an example memory cell 20 having a programmable material 22 sandwiched between a pair of electrodes 24 and 26. In some embodiment, the memory cell may be considered to be an example of a bipolar switching RRAM diode cell.

The electrodes 24 and 26 comprise electrically conductive materials 25 and 27, respectively. The materials 25 and 27 may comprise any suitable electrically conductive compositions or combinations of compositions; and in some embodiments may comprise one or more of various metals, metal-containing compositions, and conductively-doped semiconductor materials. The materials 25 and 27 may be compositionally the same as one another in some embodiments, and may be compositionally different from one another in other embodiments.

In some embodiments, the electrode 24 may be part of a first linear segment that extends along a first direction (analogous to a first linear segment described below with reference to FIG. 19), and the electrode 26 may be part of a second linear segment that extends along a second direction that crosses the first direction (analogous to one of the second linear segments described below with reference to FIG. 19). The memory cell 20 is formed at a location where the first and second linear segments overlap one another, and comprises the programmable material 22 directly between the first and second linear segments.

The programmable material 22 comprises two regions 30 and 32 which are compositionally different from one another, and which may both have characteristics of the various systems described above with reference to FIGS. 1-3. For instance, the regions 30 and 32 may comprise any of the various oxygen-based systems described with reference to FIG. 3. The compositional difference between regions 30 and 32 may be substantial, such as having a composition of one of the regions comprising one or more elements which are not common to the composition of the other of the regions. Alternatively, the compositional difference between regions 30 and 32 may be subtle, such as having the same mixture of elements within both regions, and having a stoichiometric difference between the regions. In any event, in some embodiments the difference between regions 30 and 32 is more than a transitory difference, and thus more than a mere difference in the population of ions between the two regions. The interface between the layers 30 and 32 may be abrupt in some embodiments, diffuse in some embodiments, and/or may comprise a gradient in some embodiments. Although regions 30 and 32 are described as being compositionally different than one another, in other embodiments the difference between regions 30 and 32 may be solely due to different concentrations of ions within the regions as induced by a programming operation.

Although the shown programmable material 22 has two different regions, in other embodiments a programmable material may have more than two different regions. If the programmable material has more than two different regions, all of the regions may be compositionally different from one another; or two or more of the regions may be compositionally the same as one another, and spaced from one another by at least one region which is compositionally different from them.

The regions 30 and 32 are shown to be directly against one another. In other embodiments the regions may be spaced from one another by intervening materials or regions. For instance, an embodiment discussed below with reference to FIG. 11 comprises an insulating material between the regions 30 and 32.

The regions 30 and 32 may comprise any suitable thicknesses, and may be about the same thickness as one another (as shown), or may be different thicknesses relative to one another. In some embodiments, each of the regions 30 and 32 may have a thickness of from about 5 nanometers to about 100 nanometers.

In the example embodiment FIG. 4, each of the regions 30 and 32 comprises a system which can be changed from one conductivity type to another by altering a concentration of ions (and/or ion vacancies) within the system. Both systems are influenced by the same ions (and/or ion vacancies), and thus the relative conductivity types of regions 30 and 32 may be tailored by altering the relative concentration of the ions (and/or ion vacancies) within the two regions 30 and 32.

The distribution of the ions and ion vacancies across programmable material 22 is diagrammatically indicated along the sides of the programmable material with arrows 31 and 33. Specifically, arrow 31 indicates that a concentration of ions ([I]) increases along one direction through the programmable material, and arrow 33 indicates that there is an increase in vacancies of the ion ([$V_I$]) in a direction opposite to the direction of the arrow 31.

The embodiment of FIG. 4 shows the region of programmable material having a high concentration of ions (or alternatively, a low concentration of ion vacancies) being p-type, and shows the region of the programmable material having the low concentration of ions (or alternatively, a high concentration of ion vacancies) being n-type. Such relationship of ion concentration (or ion vacancy concentration) to conductivity type is consistent with the oxygen-based systems described above with reference to FIG. 3. In other embodiments, other systems may be utilized, and the relationship of conductivity to ion concentration (or ion vacancy concentration) may be opposite to that shown in FIG. 4 (e.g., a high ion concentration, or low ion vacancy concentration, may correspond to an n-type region rather than corresponding to the p-type region shown in FIG. 4).

FIG. 4 shows memory cell 20 in two different interchangeable memory states, which are designated as a "RESET" state and a "SET" state. The regions 30 and 32 are of opposite conductivity type relative to one another in both of the "RESET" and "SET" memory states.

The two memory states of FIG. 4 are interchanged with one another by subjecting memory cell 20 to appropriate electric fields. An electric field oriented along a first direction (the field designated as $EF^{(+)}$ in FIG. 4) may shift the ion distribution (and/or the ion vacancy distribution) within the memory cell to cause the memory cell to transition from the "RESET" state to the "SET" state. An electric field oriented along a second direction opposite to that of the first direction (the field designated as $EF^{(-)}$ in FIG. 4) may shift the ion distribution (and/or the ion vacancy distribution) within the memory cell to cause the memory cell to transition from the "SET" state to the "RESET" state.

The "RESET" memory state has a pn diode in one orientation, and the "SET" memory state has a pn diode in an opposite orientation relative to that of the "RESET" state. In some embodiments, the regions 30 and 32 may be referred to as first and second regions, and the conductivity types of such regions in the "SET" state may be referred to as first and second conductivity types, respectively; with the first and second conductivity types being opposite to another. In such embodiments, the conductivity type of the first region 30 is transitioned from the first conductivity type (shown as n-type), to the second conductivity type (shown as p-type) in changing the memory cell from the "SET" state to the "RESET" state; and the conductivity type of the second region 32 is transitioned from the second conductivity type to the first conductivity type in changing the memory cell from the "SET" state to the "RESET" state. It is noted that the pn diodes of the "SET" and "RESET" memory states are formed within the programmable material 22 simultaneously with the programming of the memory cell into such memory states.

The embodiment of FIG. 4 has conductivity types of the first and second regions 30 and 32 of the "SET" state induced by changes in concentrations of ions (and/or by changes in concentrations of ion vacancies) within each of such regions. In other embodiments (for instance, embodiments discussed below with reference to FIGS. 13 and 14), one of the regions of the programmable material may have a static conductivity type (i.e., a conductivity type which is not changed in transitioning between the "RESET" and "SET" memory states). Accordingly, if the programmable material has two regions, it may be only one of such regions that has a conductivity type induced by a change in a concentration of ions (and/or by a change in a concentration of ion vacancies).

In some embodiments, the reading of the memory cell 20 of FIG. 4 comprises determination of the amount of current passed through the memory cell when an electric field is provided across the programmable material. It is noted that the conditions utilized to transition the memory cell from one memory state to another will use some suitable combination of a sufficient magnitude of electric field, coupled with a sufficient duration of time to enable redistribution of ions (and/or ion vacancies) within the programmable material. The conditions utilized during the reading operation may be chosen to have one or both of the magnitude of electric field and the duration of time that the field is applied to be too low to transition the memory cell from one memory state to another.

The electric field utilized to read the memory cell may be applied along a direction which forward biases the pn diode of the "SET" memory state, and reverse biases the pn diode of the "RESET" memory state. Accordingly, memory cells in the "SET" memory state will pass greater current then memory cells in the "RESET" memory state, and thus may be distinguished from the memory cells in the "RESET" memory state.

In the embodiment of FIG. 4, the ions (and/or ion vacancies) utilized for transitioning the memory cell from one state to another may be contained entirely within the programmable material, and diffused from one region to another during the programming of the memory cell. In such embodiments, barriers may be provided entirely around the programmable material 22 to trap the ions (and/or the ion vacancies) within the programmable material. In some embodiments, the electrodes 24 and 26 may comprise material which blocks diffusion of ions (and/or ion vacancies) therethrough (i.e., which is impermeable to the ions or ion vacancies), and may be directly against the programmable material. In some embodiments, one or more layers of barrier material (not shown) may be provided between the electrodes and the programmable material, and/or along the sides of the programmable material. Example barrier materials which may be used to block diffusion of oxygen-containing ions are described in U.S. Patent Publication No. 2010/0237442, as well as in U.S. Pat. Nos. 6,524,867, 7,727,908, 7,273,791, 7,393,785, 7,544,987 and 7,560,815. Example electrically conductive materials which may block diffusion of oxygen-containing ions, and which may be utilized in electrodes in some embodiments can include, for example, Al, Ir, Ru, RuTiN, RuTiO, RuO—Ta, CeO—Ta, TaN, etc., where such materials are shown in terms of the elements contained therein, rather than in terms of a specific stoichiometry.

If one or both of the electrodes 24 and 26 is spaced from the programmable material 22 by a barrier material (for instance, an oxygen ion-barrier material and/or an oxygen-ion-vacancy barrier material), the barrier material may be electrically insulative or electrically conductive. If the barrier material is electrically insulative, it may be formed to be thin enough that current can still pass through the barrier material during reading and programming of the memory cell. If the barrier material is electrically conductive, it may be considered to be comprised by the electrode that is directly adjacent to the barrier material.

Figure 5:
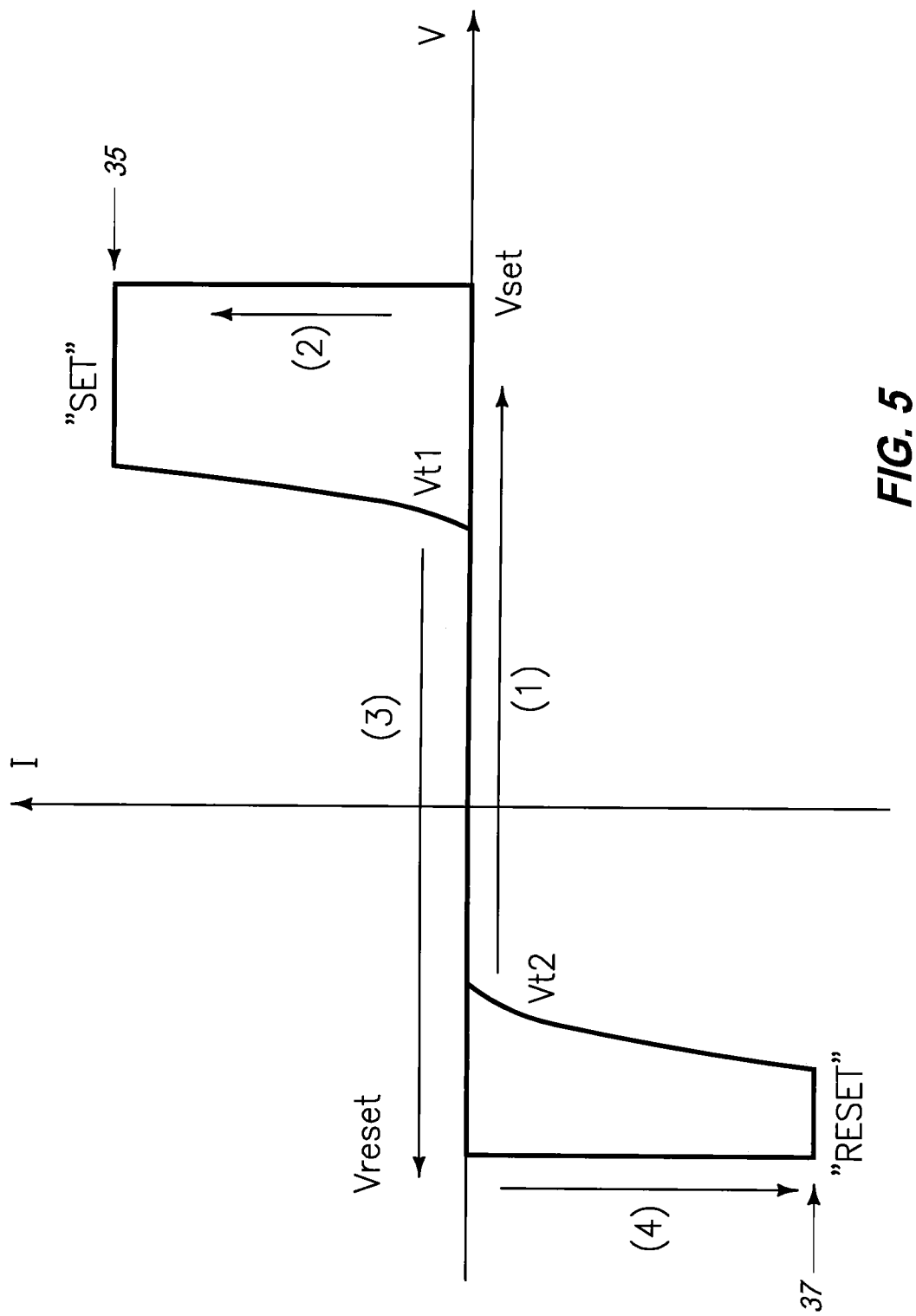
FIG. 5 is a graphical illustration of an example curve of current (I) versus voltage (V) characteristics for the memory cell of FIG. 4.

FIG. 5 shows a "current vs. voltage" curve illustrating performance characteristics of the memory cell 20 of FIG. 4. The curve has four important events which are specifically labeled along such curve.

The event (1) corresponds to an increase in voltage while the memory cell remains in the "RESET" memory state.

The next event (2) corresponds to a transition that occurs when the voltage reaches a level Vset, whereupon the pn diode of the "RESET" memory state is reversed to transition the memory cell into the "SET" memory state. It is noted that the current flow through the "SET" memory state is cut-off (i.e., truncated) at a level 35. Such truncation represents a current cut-off provided for current compliance to protect semiconductor devices. In theory, such cut-off would not exist for an idealized memory device utilized in the absence of other circuitry, but in practice it is generally utilized.

The next event (3) corresponds to a decrease in voltage while the memory device remains in the "SET" memory state. There is a voltage level indicated as Vt1, which is below the level Vset, but at which substantial current flows through the memory cell in the "SET" memory state. Such level may correspond to a suitable voltage level for reading the memory device without inadvertently tripping the device into the "SET" or "RESET" memory state.

The next event (4) corresponds to a transition that occurs when the voltage reaches a level Vreset, whereupon the pn diode of the "SET" memory state is reversed to transition the memory cell into the "RESET" memory state. The current flow through the "RESET" memory state may be cut-off at a level 37 for the current compliance reasons discussed above relative to the cut-off level 35.

The "RESET" memory state of the memory cell 20 of FIG. 4 may be exactly the opposite of the "SET" memory state of such memory cell. Accordingly, reading of the memory cell may comprise utilization of electric field oriented such that the pn diode of the "RESET" is forward biased, while the pn diode of the "SET" state is reverse biased. Such read operation is diagrammatically illustrated in FIG. 5 by indicating a voltage level Vt2 which could be utilized analogously to the above-discussed voltage level Vt1, but which would forward bias the pn diode of the "RESET" memory state.

It can be advantageous that the memory cell 20 of FIG. 4 has the two different and opposite read operations which may be accomplished by either forward biasing the pn diode of the "SET" memory state or the pn diode of the "RESET" memory state. For instance, such can provide additional flexibility for design of read operations to be utilized for ascertaining the memory states of the various memory cells in a memory cell array. However, in some embodiments it is also acceptable to use only one read operation to distinguish the two states.

Figure 6:
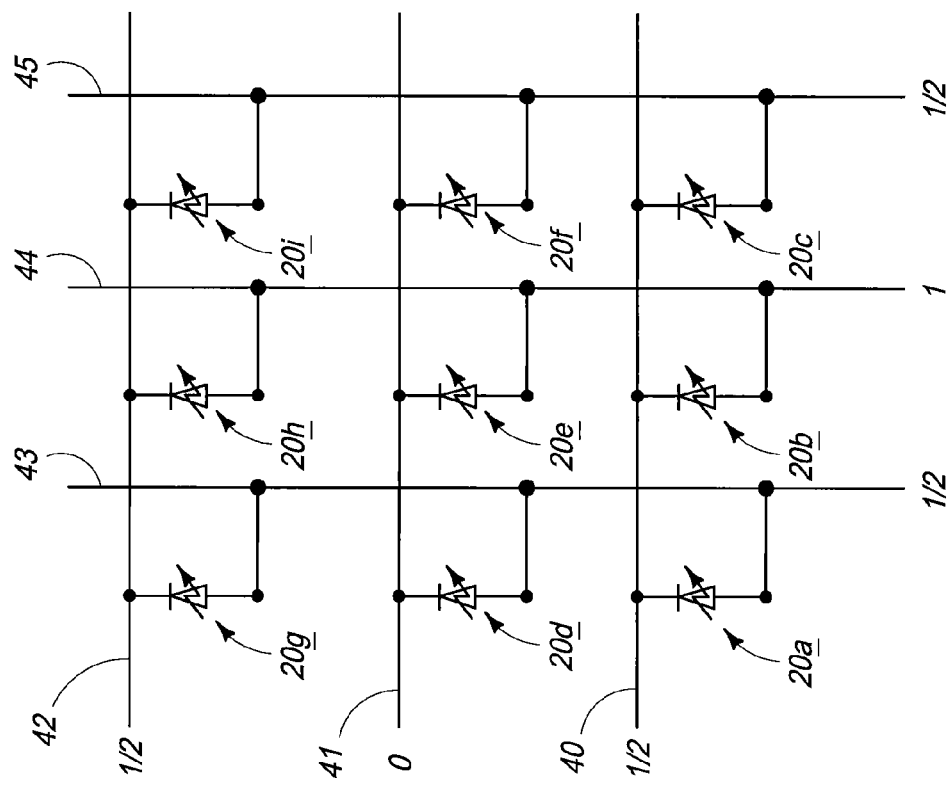
FIG. 6 is a schematic illustration of an example circuit layout that may be utilized for an array of memory cells having characteristics of the FIG. 4 memory cell.

The memory cell 20 of FIG. 4 has an intrinsic pn diode within the programmable material after the programmable material is transitioned into a memory state. Such intrinsic diode may eliminate the need for the extrinsic diodes (or other select devices) paired with the cross-point memory cells. FIG. 6 shows a schematic diagram of a portion of a memory array 38. Such memory array comprises a plurality of cross-point memory cells 20a-20i. The memory array also comprises a series of first access lines 40-42 extending along a first direction, and a series of second access lines 43-45 extending along a second direction, and intersecting with the first access lines. The memory cells 20a-20i are provided at locations where the first access lines intersect the second access lines, and thus each memory cell may be uniquely addressed through the combination of a first access line and a second access line.

FIG. 6 shows that voltages of ½ unit, 0 unit and ½ unit, respectively are along the access lines 40, 41 and 42; and that voltages of ½ unit, 1 unit and ½ unit, respectively are along access lines 43, 44 and 45. In the shown configuration, the memory cell 20e will experience an electric field of 1 unit, which will be significantly larger than the electric field experienced by any of the other memory cells. For instance, memory cells 20a, 20c, 20g and 20i may experience electric fields of about 0 units, while the memory cells 20b, 20d, 20f and 20h may experience electric fields of about ½ unit. Thus, the memory cell 20e may be uniquely addressed for programming, and similarly may be uniquely addressed for reading. Each of the other of memory cells may be analogously uniquely addressed for programming and reading. The programming voltage utilized for programming the memory cells of FIG. 6 may be, for example, from about 1 volt about 4 volts.

Figure 7:
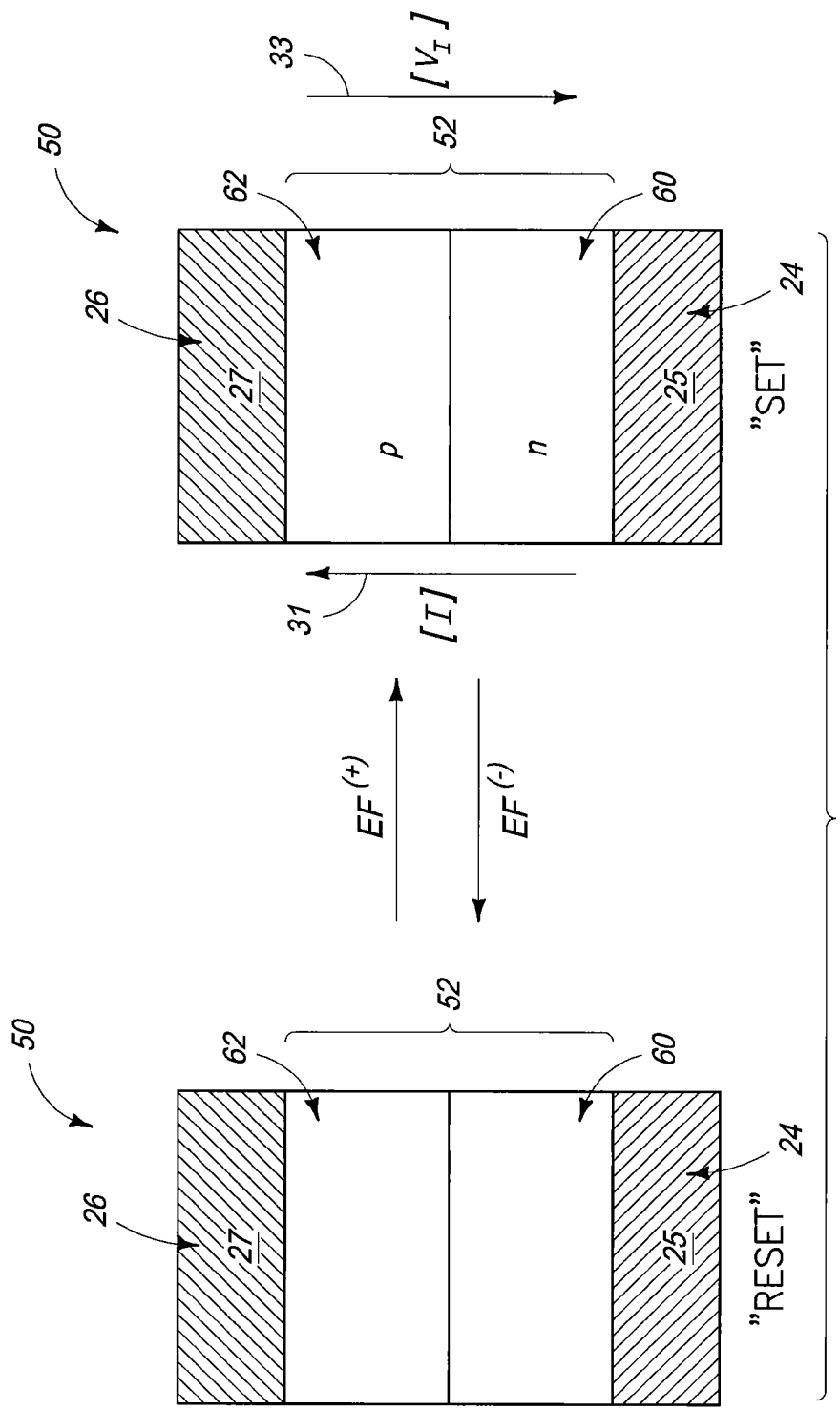
FIG. 7 shows diagrammatic views of another example embodiment memory cell in a first memory state (a "RESET" state) and a second memory state (a "SET" state), with such memory states being shown to be interchangeable through application of electric field (EF).

FIG. 7 shows an example embodiment memory cell 50, which is different than the example embodiment memory cell 20 of FIG. 4. In referring to FIG. 7, similar numbering will be used as is used above in describing the memory cell of FIG. 4, where appropriate.

The memory cell 50 has a programmable material 52 sandwiched between the pair of electrodes 24 and 26. The programmable material comprises two regions 60 and 62 which are compositionally different from one another. One or both of the regions may comprise a system which changes conductivity type depending upon the concentration of ions (and/or depending on the concentration of ion vacancies) within such system. For instance, one or both of the regions may comprise a system of any of the types described above with reference to FIGS. 1-3.

The memory cell 50 is shown to have interchangeable "RESET" and "SET" memory states; with such states being interchanged using the electric fields $EF^{(+)}$ and $EF^{(-)}$.

The "SET" memory state is similar to the "SET" memory state of the FIG. 4 memory cell, and accordingly comprises a pn diode within the programmable material 52. Further, the "SET" state of memory cell 50 is shown to have ions (or vacancies) diffused within both of the regions 60 and 62. The arrows 31 and 33 are provided along the memory cell in the "SET" memory state to illustrate that an ion concentration increases along a direction from region 60 to 62, and that an ion vacancy concentration increases along a direction from region 62 to 60. The shown embodiment has a p-type region at high levels of the ion concentration (or alternatively considered, at low levels of the ion vacancy concentration); and has an n-type region at low levels of the ion concentration (or alternatively considered, at high levels of the ion vacancy concentration). In other embodiments, the relative dependence on the ion concentration (or ion vacancy concentration) of the p-type and n-type regions may be reversed—i.e., the n-type region may occur at high concentrations of the ions (or low concentrations of ion vacancies), and the p-type region may occur at low concentrations of the ions (or high concentrations of ion vacancies).

The regions 60 and 62 in the "RESET" memory state of the memory cell are not labeled relative to n-type and p-type. In some embodiments, one or both of the regions 60 and 62 may have electrically insulative properties in the "RESET" memory state. For instance, one or both of the regions 60 and 62 may have ions (or vacancies) diffused therein to a concentration corresponding to the regime 12 of FIGS. 1-3. Such regime is neither n-type nor p-type, and in some embodiments may have characteristics of electrically insulative material. Alternatively, the electrically insulative regime may occur in one or both of the regimes 9 and 15 of FIGS. 1-3 when the ion concentration (or ion vacancy concentration) is outside of appropriate concentrations for the n-type and p-type regimes 10 and 14.

Although neither of the regions 60 and 62 of the "RESET" state is specifically labeled as n-type or p-type, in some embodiments one of the regions may be n-type or p-type, while the other is electrically insulative. For instance, region 60 may be n-type or p-type, while region 62 is electrically insulative; or vice versa.

In an example embodiment in which region 60 is p-type and region 62 is electrically insulative, the transition to the "SET" memory state comprises changing conductivity of both regions. Specifically, region 62 is changed from electrically insulative to p-type, and region 60 is changed from p-type to n-type.

In an example embodiment in which region 60 is n-type and region 62 is electrically insulative, the transition to the "SET" memory state comprises changing conductivity of only region 62. Specifically, region 62 is changed from electrically insulative to p-type, while region 60 remains n-type.

Even though region 60 may remain n-type in both the "RESET" and "SET" memory states of the memory cell, the concentration of ion vacancies within region 60 may increase (and/or the concentration of ions may decrease) in going from the "RESET" memory state to the "SET" memory state. For instance, regions 60 and 62 may comprise different systems, with the system of region 62 needing a higher concentration of ion vacancies (and/or a lower concentration of ions) to transition into a p-type regime than does the region 60. Thus, in the "RESET" memory state the region 60 may be n-type even though it has a significant ion concentration (and/or has a low concentration of ion vacancies). Subsequently, the transition into the "SET" state may comprise diffusion of ions from region 60 into region 62 (and/or diffusion of ion vacancies from region 62 to region 60), and there may be enough ions (and/or ion vacancies) migrating between regions 60 and 62 to convert the system of region 62 into the p-type regime. As another example, regions 62 and 60 may comprise similar systems, but region 62 may be much thinner than region 60. Thus, even though the concentration of ions and/or vacancies within the region 60 is insufficient to achieved the necessary concentration to convert the thick region 60 into the p-type regime in the "RESET" memory state, there are enough ions and/or ion vacancies migrating between the thick region 60 and the thin region 62 during the transition to the "SET" memory state to convert region 62 into the p-type regime Alternatively, region 60 may be an n-type semiconductor material that is not affected by the ion concentration (or ion vacancy concentration), analogously to constructions discussed below with reference to FIG. 13.

Figure 8:
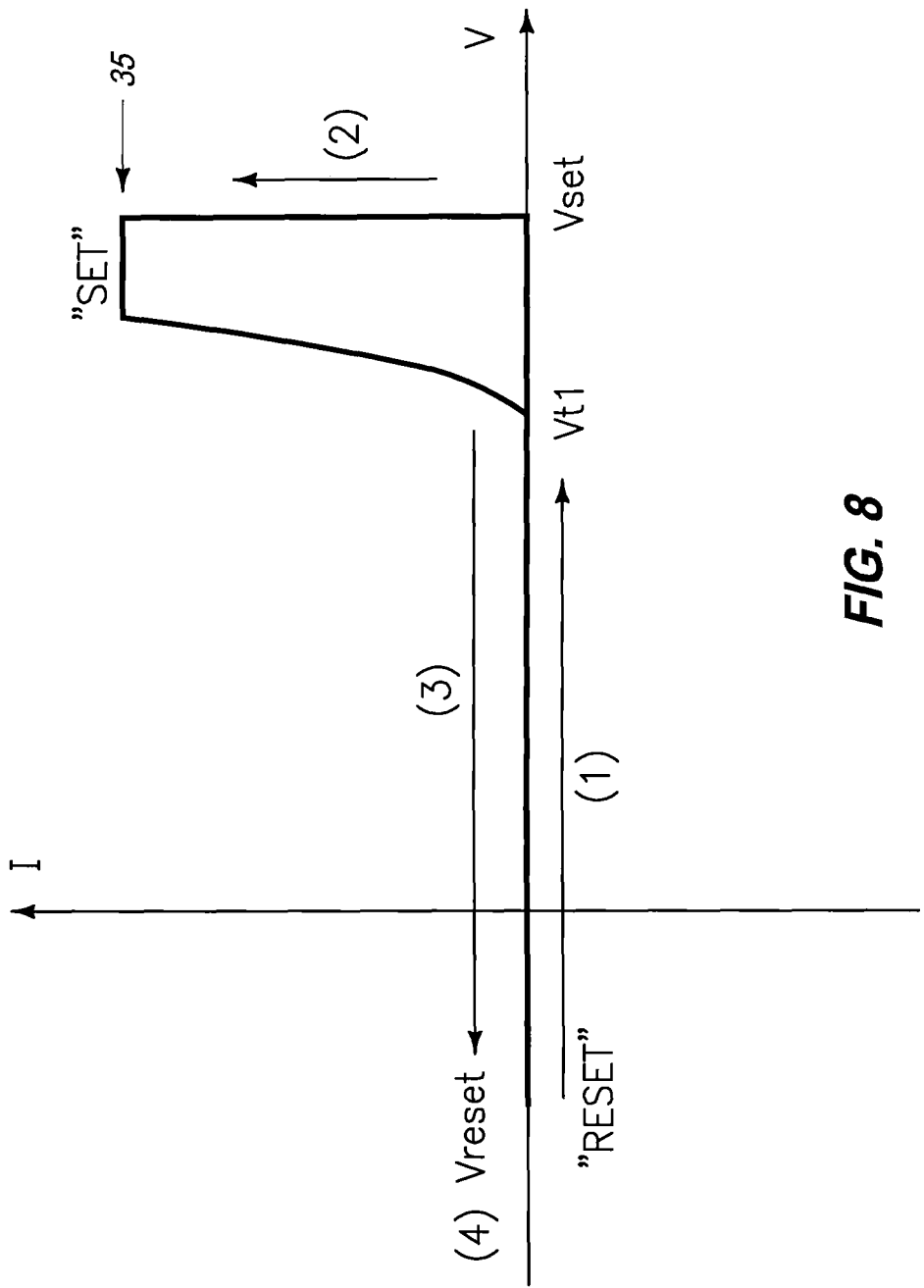
FIG. 8 is a graphical illustration of an example curve of current (I) versus voltage (V) characteristics for the memory cell of FIG. 7.

FIG. 8 shows a "current vs. voltage" curve illustrating performance characteristics of the memory cell 50 of FIG. 7. The curve has four important events which are specifically labeled along such curve, with such events being analogous to the events described above with reference to the "current vs. voltage" curve of FIG. 5.

The event (1) corresponds to an increase in voltage while the memory cell remains in the "RESET" memory state. In the shown embodiment, the programmable material 52 (FIG. 7) has at least one electrically insulative region (i.e., at least one of the regions 60 and 62 of FIG. 7 is electrically insulative in the "RESET" state), and thus no current flows through the memory cell while the cell is in the "RESET" state.

The next event (2) corresponds to a transition that occurs when the voltage reaches a level Vset, whereupon the pn diode of the "SET" memory state is formed. The current flow through the "SET" memory state has the cut-off at level 35 discussed above with reference to FIG. 5.

The next event (3) corresponds to a decrease in voltage while the memory device remains in the "SET" memory state. There is a voltage level indicated as Vt1 analogous to the level Vt1 discussed above with reference to FIG. 5. Such level may correspond to a suitable voltage level for reading the memory device.

The next event (4) corresponds to a transition that occurs when the voltage reaches a level Vreset, whereupon the at least one insulative region is reformed, and current ceases to flow through the memory device.

Figure 9:
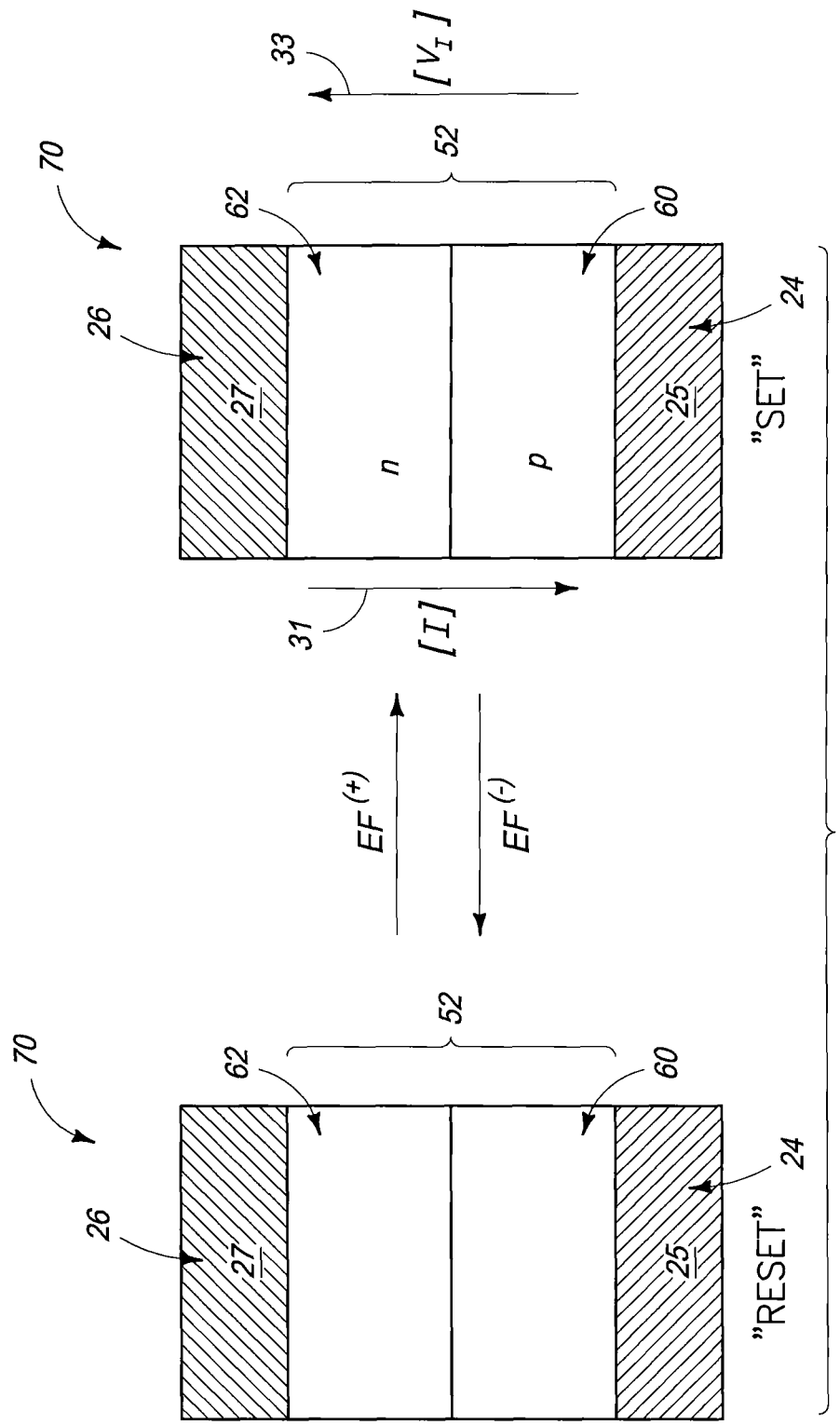
FIG. 9 shows diagrammatic views of another example embodiment memory cell in a first memory state (a "RESET" state) and a second memory state (a "SET" state), with such memory states being shown to be interchangeable through application of electric field (EF).

FIG. 9 shows another example embodiment memory cell 70. The memory cell 70 is equivalent to the memory cell 50 of FIG. 7, but inverted relative to the memory cell of FIG. 7.

The memory cell 70 has the programmable material 52 sandwiched between the pair of electrodes 24 and 26. The programmable material comprises the two regions 60 and 62 described above.

The memory cell 70 has the interchangeable "RESET" and "SET" memory states described above with reference to FIG. 7. However, the pn diode within the "SET" memory state of FIG. 9 is inverted relative to that of FIG. 7. Arrows 31 and 33 are provided in FIG. 9 along the memory cell in the "SET" memory state to illustrate that an ion concentration increases along a direction from region 62 to 60, and that an ion vacancy concentration increases along a direction from region 60 to 62.

Like the embodiment of FIG. 7, neither of the regions 60 and 62 of the "RESET" state of FIG. 9 is specifically labeled as n-type or p-type. In some embodiments both of the regions 60 and 62 may be electrically insulative in the "RESET" state of FIG. 9; and in other embodiments one of the regions may be n-type or p-type, while the other is electrically insulative. For instance, region 60 may be n-type or p-type, while region 62 is electrically insulative.

In an example embodiment in which region 60 is n-type and region 62 is electrically insulative, the transition to the "SET" memory state comprises changing conductivity of both regions. Specifically, region 62 is changed from electrically insulative to n-type, and region 60 is changed from n-type to p-type. Such may comprise diffusing ions (or vacancies) from the insulative region 62 of the "RESET" memory state into the region 60 to transition to the "SET" memory state.

In an example embodiment in which region 60 is p-type and region 62 is electrically insulative, the transition to the "SET" memory state comprises changing conductivity of only the region 62. Specifically, region 62 is changed from electrically insulative to n-type, while region 60 remains p-type. Such may comprise diffusing ions (or vacancies) between the regions 60 and 62. The shown configuration is an example configuration in which regions with a relatively high ion concentration (and a relatively low ion vacancy concentration) are p-type, and regions with a relatively low ion concentration are n-type (and a relatively high ion vacancy concentration).

Figure 10:
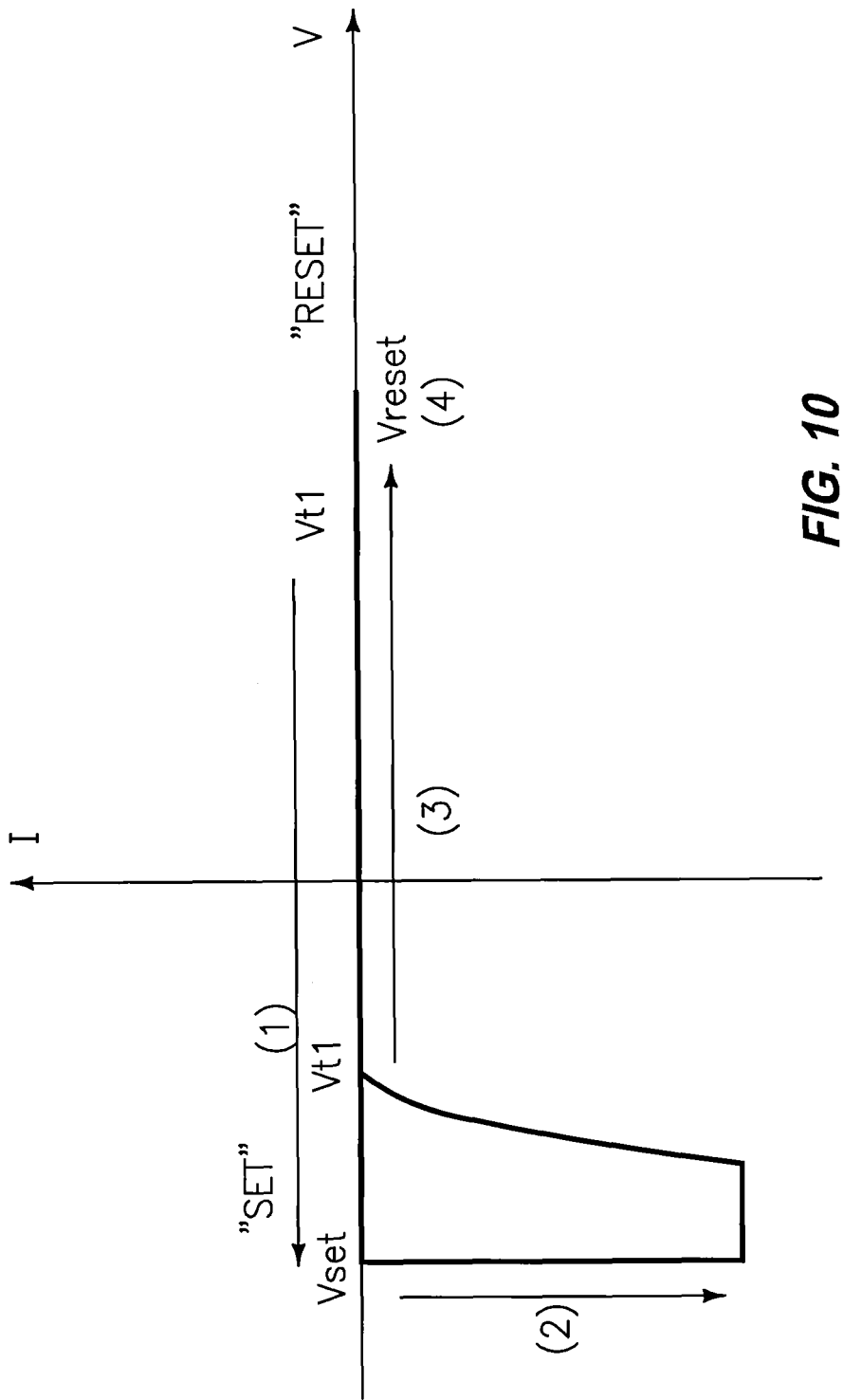
FIG. 10 is a graphical illustration of an example curve of current (I) versus voltage (V) characteristics for the memory cell of FIG. 9.

FIG. 10 shows a "current vs. voltage" curve illustrating performance characteristics of the memory cell 70 of FIG. 9. The curve has four important events which are specifically labeled along such curve, with such events being analogous to those described above with reference to FIG. 8, but of opposite orientation relative to those of FIG. 8.

The event (1) of FIG. 10 corresponds to a decrease in voltage while the memory cell remains in the "RESET" memory state.

The next event (2) corresponds to a transition that occurs when the voltage reaches a level Vset, whereupon the pn diode of the "SET" memory state is formed.

The next event (3) corresponds to an increase in voltage while the memory device remains in the "SET" memory state. There is a voltage level indicated as Vt1 analogous to the level Vt1 discussed above with reference to FIG. 8, which may correspond to a suitable voltage level for reading the memory device.

The next event (4) corresponds to a transition that occurs when the voltage reaches a level Vreset, whereupon the at least one insulative region is reformed, and current ceases to flow through the memory device.

Figure 11:
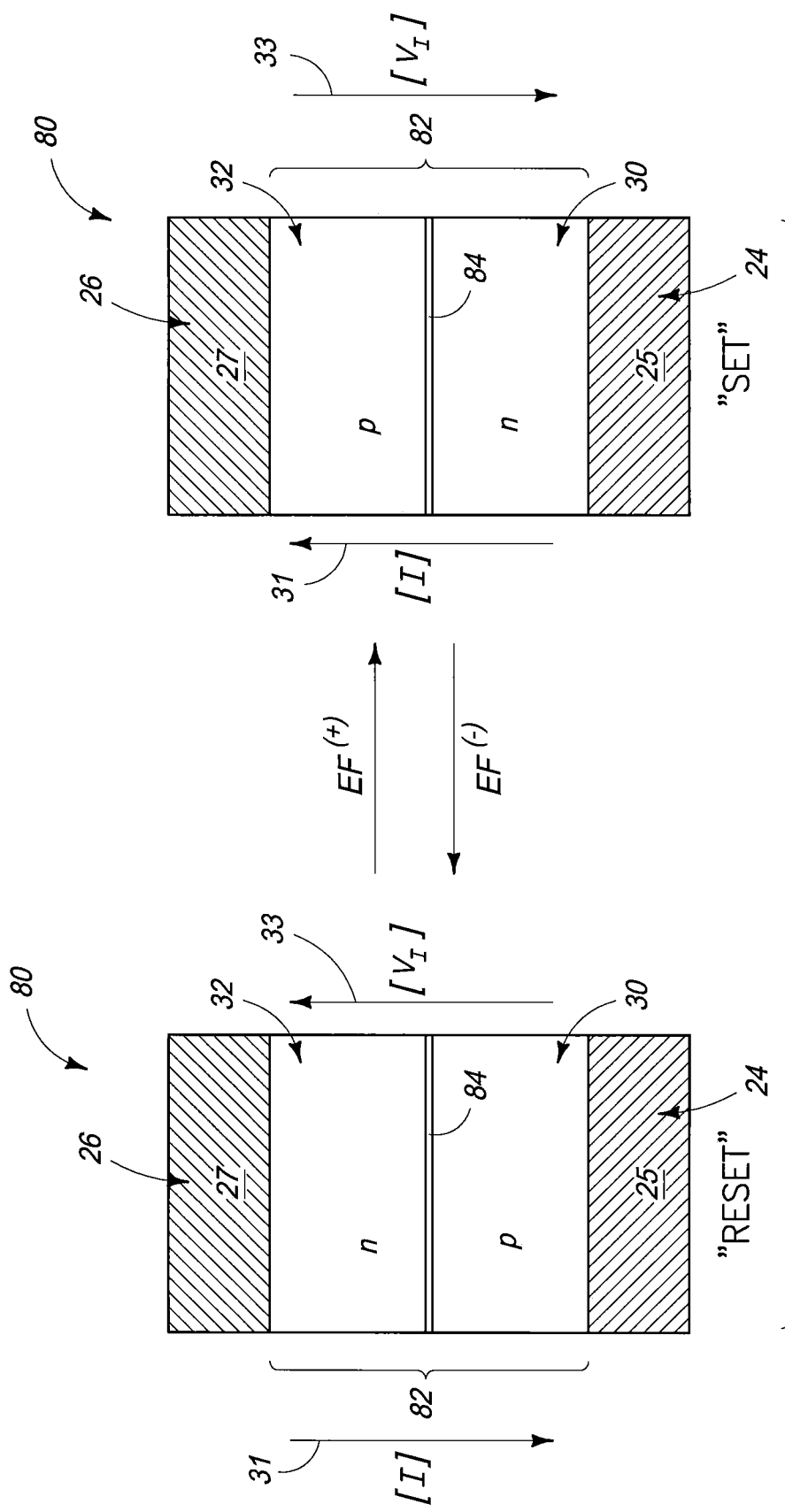
FIG. 11 shows diagrammatic views of another example embodiment memory cell in a first memory state (a "RESET" state) and a second memory state (a "SET" state), with such memory states being shown to be interchangeable through application of electric field (EF).

FIG. 11 shows another example embodiment memory cell 80 with interchangeable "RESET" and "SET" memory states. In referring to FIG. 11, similar numbering will be used as is used above in describing the memory cell of FIG. 4, where appropriate.

The memory cell 80 has a programmable material 82 between the pair of electrodes 24 and 26. The programmable material 82 comprises the two regions 30 and 32 described above with reference to the memory cell 20 of FIG. 4. However, the memory cell 80 differs from the memory cell 20 of FIG. 4 in that the memory cell 80 comprises an ion (and/or ion vacancy) reservoir 84 between the regions 30 and 32. The reservoir 84 may comprise electrically conductive material in some embodiments, and may comprise electrically insulative material in some embodiments.

In some embodiments, the ions may be oxygen-containing species, and accordingly the reservoir may be a material which contains an excess of oxygen-containing species in at least one of the memory states. For instance, the reservoir may be an insulative material comprising oxygen-enriched oxide (such as silicon oxide, aluminum oxide, etc.) in at least one of the memory states. The reservoir may be permeable to the ions (and/or to the ion vacancies) in some embodiments.

The ion (and/or ion vacancy) reservoir may be kept very thin so that it does not substantially interfere with current flow through the programmable material in the "SET" memory state, and in example embodiments may have a thickness of less than or equal to about 50 angstroms, less than or equal to about 20 angstroms, or any other suitable thickness.

The reservoir may act as a source of ions (and/or ion vacancies) for altering one or both of ion density and ion vacancy density in one of the regions of the programmable material during a transition from the "RESET" memory state to the "SET" memory state, or vice versa; and/or may act as a sink for excess ions, or ion vacancies, during transitioning from one memory state to the other. In some embodiments, the reservoir may facilitate movement of ions (and/or ion vacancies), which may facilitate rapid switching from one memory state to another, and may thus improve one or both of reading speed and writing speed.

The reservoir 84 may be placed in any suitable location within the programmable material, and in some embodiments there may be more than one reservoir of ions (and/or ion vacancies) provided within the programmable material. In the shown embodiment, the reservoir 84 is between the regions 30 and 32, and directly against both of such regions. In other embodiments, the reservoir may be placed in other locations.

Figure 12:
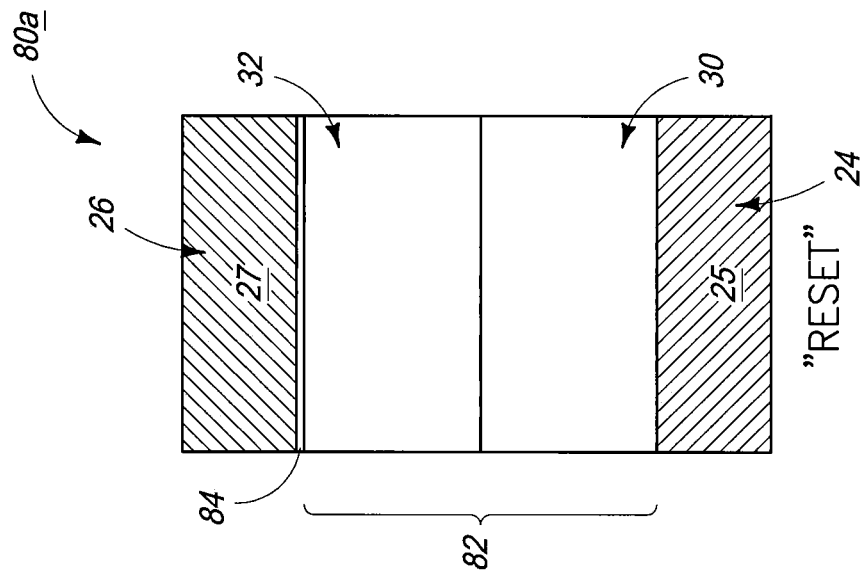
FIG. 12 is a diagrammatic view of another example embodiment memory cell.

FIG. 12 illustrates example embodiment memory cell 80a analogous to the memory cell 80 of FIG. 11, but comprising the reservoir 84 along a top of the programmable material, rather than in a middle of the programmable material; and specifically directly between the region 32 and the top electrode 26. As noted above, in some embodiments the reservoir 84 may correspond to an electrically conductive material.

Accordingly, in some embodiments the memory cell of FIG. 12 may be considered to comprise an electrically conductive material 84 directly between the top electrode 26 and the top region 32 of the programmable material.

Figure 13:
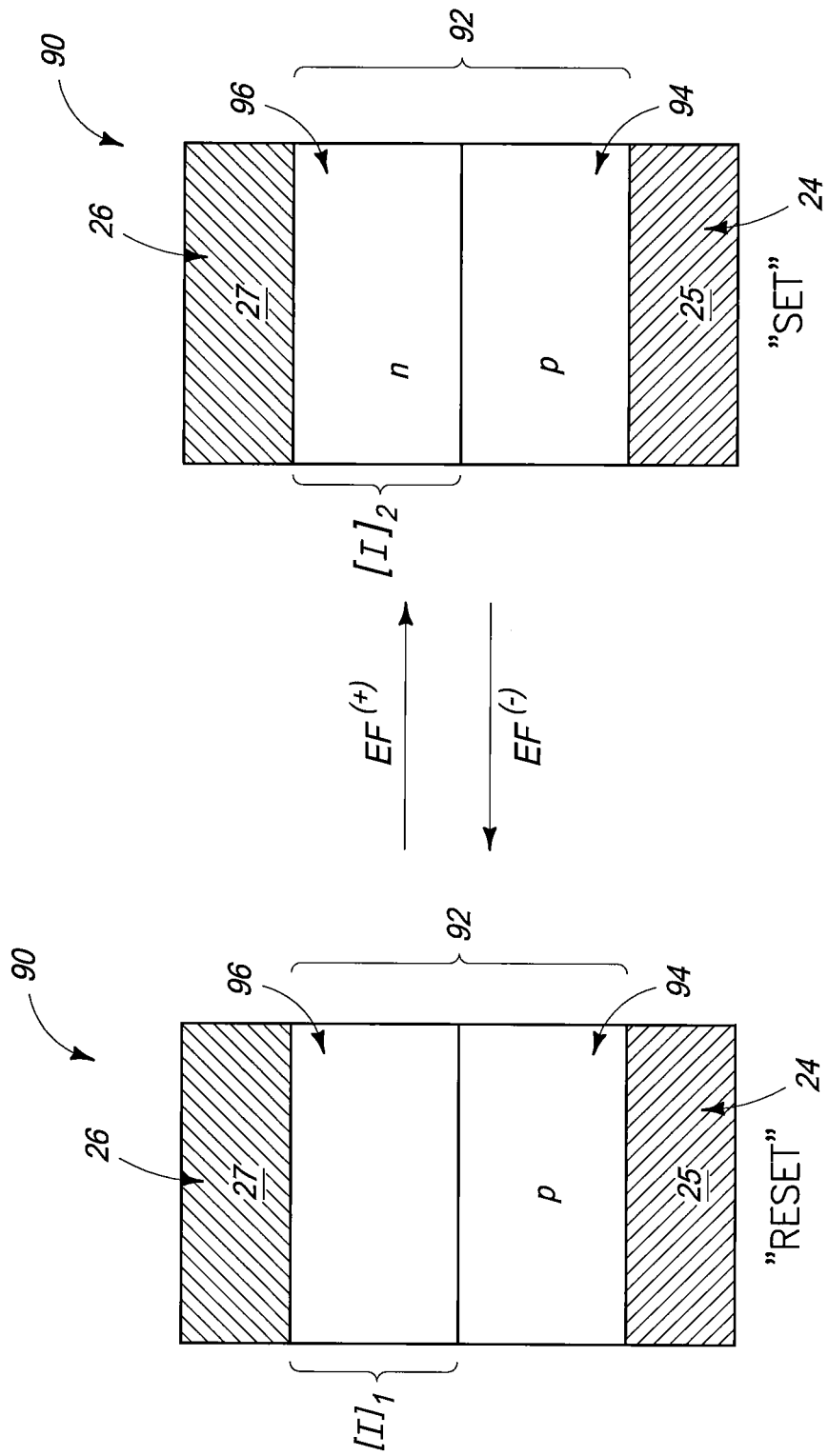
FIG. 13 shows diagrammatic views of another example embodiment memory cell in a first memory state (a "RESET" state) and a second memory state (a "SET" state), with such memory states being shown to be interchangeable through application of electric field (EF).

FIG. 13 shows another example embodiment memory cell 90 with interchangeable "RESET" and "SET" memory states. In referring to FIG. 13, similar numbering will be used as is used above in describing the memory cell of FIG. 4, where appropriate.

The memory cell 90 has a programmable material 92 between the pair of electrodes 24 and 26. The programmable material comprises two regions 94 and 96 which are compositionally different from one another. The region 94 comprises p-type doped semiconductor material (for instance, p-type doped silicon) while the region 96 comprises a system which changes conductivity type depending upon the concentration of ions, or ion-vacancies, within such system. For instance, the region 96 may comprise a system of any of the types described above with reference to FIGS. 1-3. The conductivity of the doped semiconductor material of region 94 does not change in transitioning between the "RESET" memory state and the "SET" memory state, and in the shown embodiment remains p-type in both memory states.

The region 96 is shown to have n-type conductivity in the "SET" memory state, so that regions 94 and 96 together form a pn diode in the "SET" memory state.

The region 96 may have electrically insulative properties in the "RESET" state, and an electric field which forward biases the pn diode of the "SET" may be utilized to distinguish the "RESET" memory state from the "SET" memory state.

In the shown embodiment, ions (or vacancies) within programmable material 92 are only within the region 96 in both the "RESET" and "SET" memory states (as indicted by the concentration of ions ([I]) being shown only within the region 96 in FIG. 13). Accordingly, region 94 of the programmable material does not act as a reservoir of ions or vacancies during the transition between the "RESET" and "SET" memory states. Rather, electrode 26 may be configured to be permeable to the ions (and/or vacancies), so that ions (and/or vacancies) may pass through such electrode during transitioning between the "RESET" memory state and the "SET" memory state. Any suitable electrically conductive material permeable to the ions and/or vacancies may be utilized for the electrode 26. Example materials which are permeable to oxygen-containing ions may include Pt and/or materials described in U.S. Pat. No. 7,273,791.

The region 96 has a first concentration of ions and/or vacancies, shown as $[I]_1$, in the "RESET" memory state; and a second concentration of ions and/or vacancies, shown as $[I]_2$, in the "SET" memory state. The second concentration of ions and/or vacancies is different than the first concentration, and such difference leads to the change in conductivity of the region 96 in transitioning from the "RESET" memory state to the "SET" memory state. In some embodiments the concentration $[I]_1$ may be about 0 ions per unit volume, and in other embodiments it may be larger than 0 ions per unit volume.

Although the upper region 96 is shown to be the region which is altered in response to concentration of ions and vacancies in the embodiment of FIG. 13, in other embodiments it may be the lower region 94 which is altered while the upper region 96 is the conductively-doped semiconductor material. Also, although the p-type doped region of the memory cell is shown to be the region corresponding to doped semiconductor material, in other embodiments it may be the n-type region which corresponds to doped semiconductor material. For instance, an embodiment analogous to that of FIG. 13 has region 96 corresponding to n-type doped semiconductor material, and region 94 corresponding to a system which is in an insulative regime in the "RESET" memory state, and then transitions to the p-type regime in the "SET" memory state due to migration of ions (and/or vacancies) from or to such system.

Figure 14:
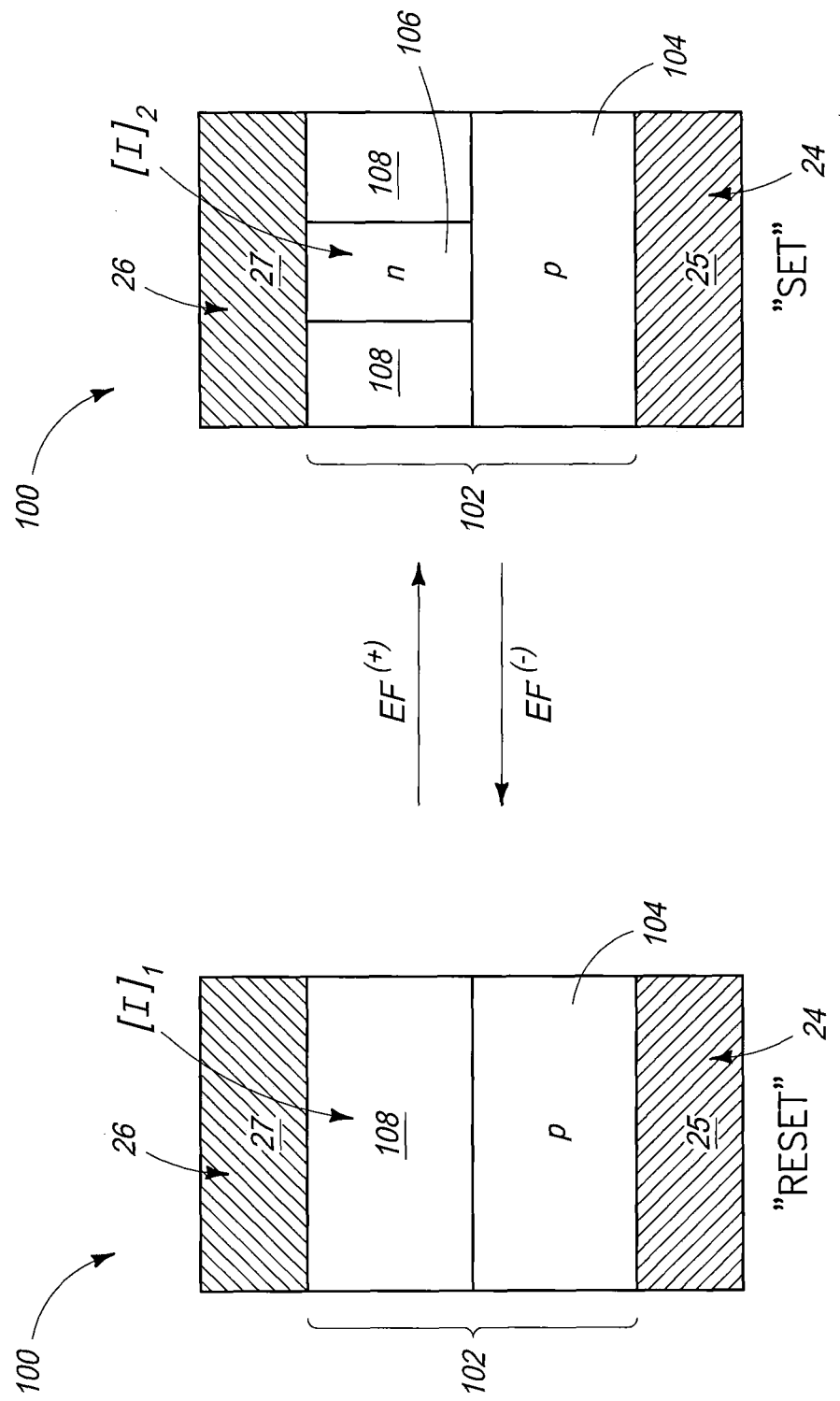
FIG. 14 shows diagrammatic views of another example embodiment memory cell in a first memory state (a "RESET" state) and a second memory state (a "SET" state), with such memory states being shown to be interchangeable through application of electric field (EF).

FIG. 14 shows another example embodiment memory cell 100 with interchangeable "RESET" and "SET" memory states. In referring to FIG. 14, similar numbering will be used as is used above in describing the memory cell of FIG. 4, where appropriate.

The memory cell 100 has a programmable material 102 between the pair of electrodes 24 and 26. The programmable material comprises two regions 104 and 108 which are compositionally different from one another. The region 104 comprises p-type doped semiconductor material (for instance, p-type doped silicon) while the region 108 comprises a system which changes conductivity type depending upon the concentration of ions and/or vacancies within such system. For instance, the region 108 may comprise a system of any of the types described above with reference to FIGS. 1-3. The conductivity of the doped semiconductor material of region 104 does not change in transitioning between the "RESET" memory state and the "SET" memory state, and in the shown embodiment remains p-type in both memory states.

The memory cell 100 may be fabricated with any suitable methodology. For instance, the construction may be fabricated by providing the material 108 over region 104. The region 106 may be formed during switching from the "RESET" to "SET" state — as a push (or growth) of a conductive filament through the material 108, and may be removed during switching from the "SET" to "RESET" state by dissolving the conductive filament.

The region 108 has a first concentration of ions and/or ion-vacancies (shown as $[I]_1$) in the "RESET" memory state, and the region 106 has a second concentration of ions and/or ion-vacancies (shown as $[I]_2$) in the "SET" memory state. The second concentration is different than the first concentration, and such difference leads to formation of the filamentous region 106 in transitioning from the "RESET" memory state to the "SET" memory state. In some embodiments, the concentration $[I]_1$ may be about 0 ions per unit volume, and in other embodiments it may be larger than 0 ions per unit volume.

The memory cell 100 may be operated identically to the memory cell 90 discussed above with reference to FIG. 13. Notably, the filamentous region 106 directly contacts both the p-type region 104 and the upper electrode 26 in the shown embodiment.

The memory cell 100 is an example memory cell having a first conductivity type filament extending between an electrode and a second conductivity type region, and other similar memory cells may be formed in other embodiments. For instance, in some embodiments, the region 104 may be n-type doped semiconductor material, and thus may be statically n-type in transitioning between the "RESET" memory state and the "SET" memory state. In such embodiments, the filamentous region 106 may be p-type.

Any suitable process may be utilized to form the various memory cells discussed above with reference to FIGS. 1-14. An example process for forming an array of memory cells is described with reference to FIGS. 15-19.

Figure 15:
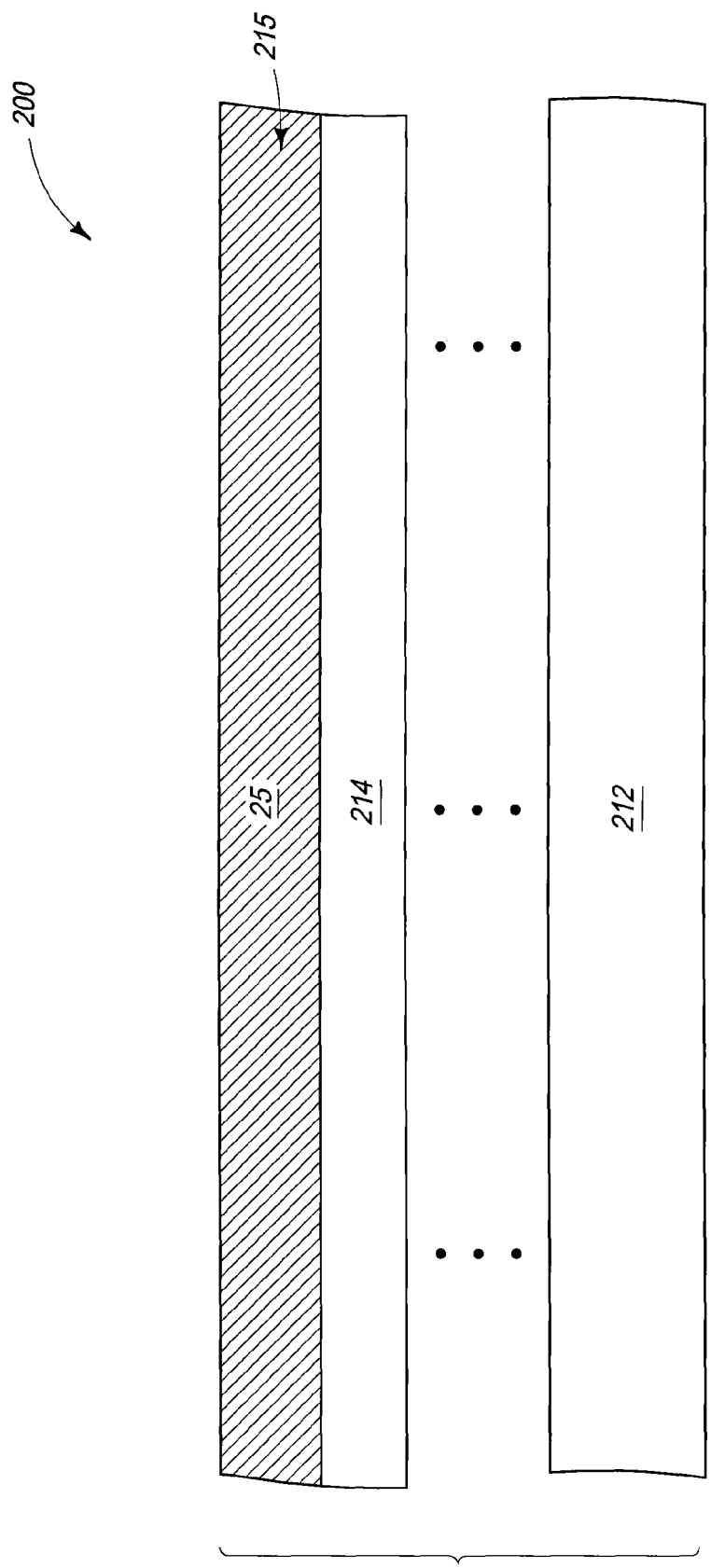
FIGS. 15-19 show diagrammatic cross-sectional views of a portion of a semiconductor construction at various stages of an example embodiment process for fabricating a memory array.

Referring to FIG. 15, a construction 200 is shown to comprise a base 212, an electrically insulative material 214 over the base, and a line 215 of the electrically conductive electrode material 25 over such electrically insulative material.

The base 212 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 212 is shown to be homogenous, the base may comprise numerous materials in some embodiments. For instance, base 212 may correspond to a semiconductor substrate containing one or more materials associated with integrated circuit fabrication. In such embodiments, such materials may correspond to one or more of refractory metal materials, barrier materials, diffusion materials, insulator materials, etc.

The electrically insulative material 214 is shown to be spaced from the base 212 by other levels of integrated circuitry. Such levels may include logic, wiring, memory, etc. Alternatively, the electrically insulative material 214 may be directly against an upper surface of semiconductor material (for instance, monocrystalline silicon) of base 212 in some embodiments.

The electrically insulative material 214 may comprise any suitable composition or combination of compositions, and may, for example, comprise one or more of silicon dioxide, silicon nitride, doped silicate glass (e.g., borophosphosilicate glass, phosphosilicate glass, fluorosilicate glass), etc.

The line 215 of the electrode material 25 is shown extending along a direction within the plane of the cross-section of FIG. 15.

Figure 16:
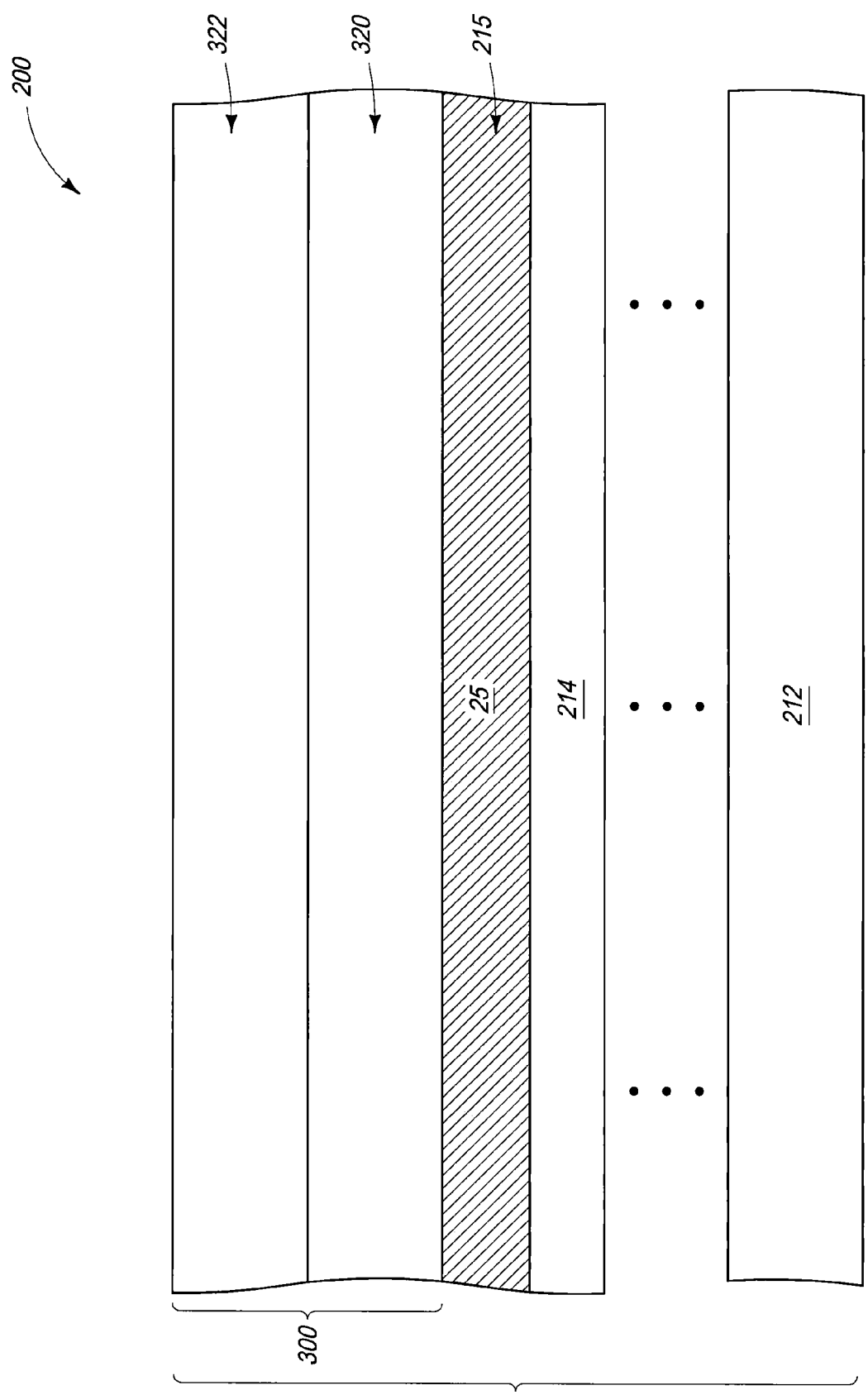

Referring to FIG. 16, regions 320 and 322 of the programmable material 300 are formed over electrode material 25. In some embodiments, a barrier material of the type described above with reference to FIG. 4 (not shown) may be formed over the electrode 25 prior to formation of programmable material 300. The regions 320 and 322 may comprise any suitable materials, including, for example, any of the materials of the regions 30 and 32 of FIG. 4, the regions 60 and 62 of FIG. 7, the regions 94 and 96 of FIG. 13, etc. In some embodiments, the regions 320 and 322 may comprise one or more of the oxygen-containing materials of the systems described above with reference to FIG. 3. The regions 320 and 322 may be referred to as a first region and a second region respectively, with the second region being formed over the first region. In some embodiments the first region may ultimately correspond to an n-type doped region of a pn diode formed in the "SET" memory state of a memory cell (such as the memory cell 20 of FIG. 4), and in other embodiments the first region may ultimately correspond to the p-type doped region of such diode. In some embodiments, reservoir material analogous to the material 84 of FIGS. 11 and 12 may be incorporated into the programmable material 300.

Figure 17:
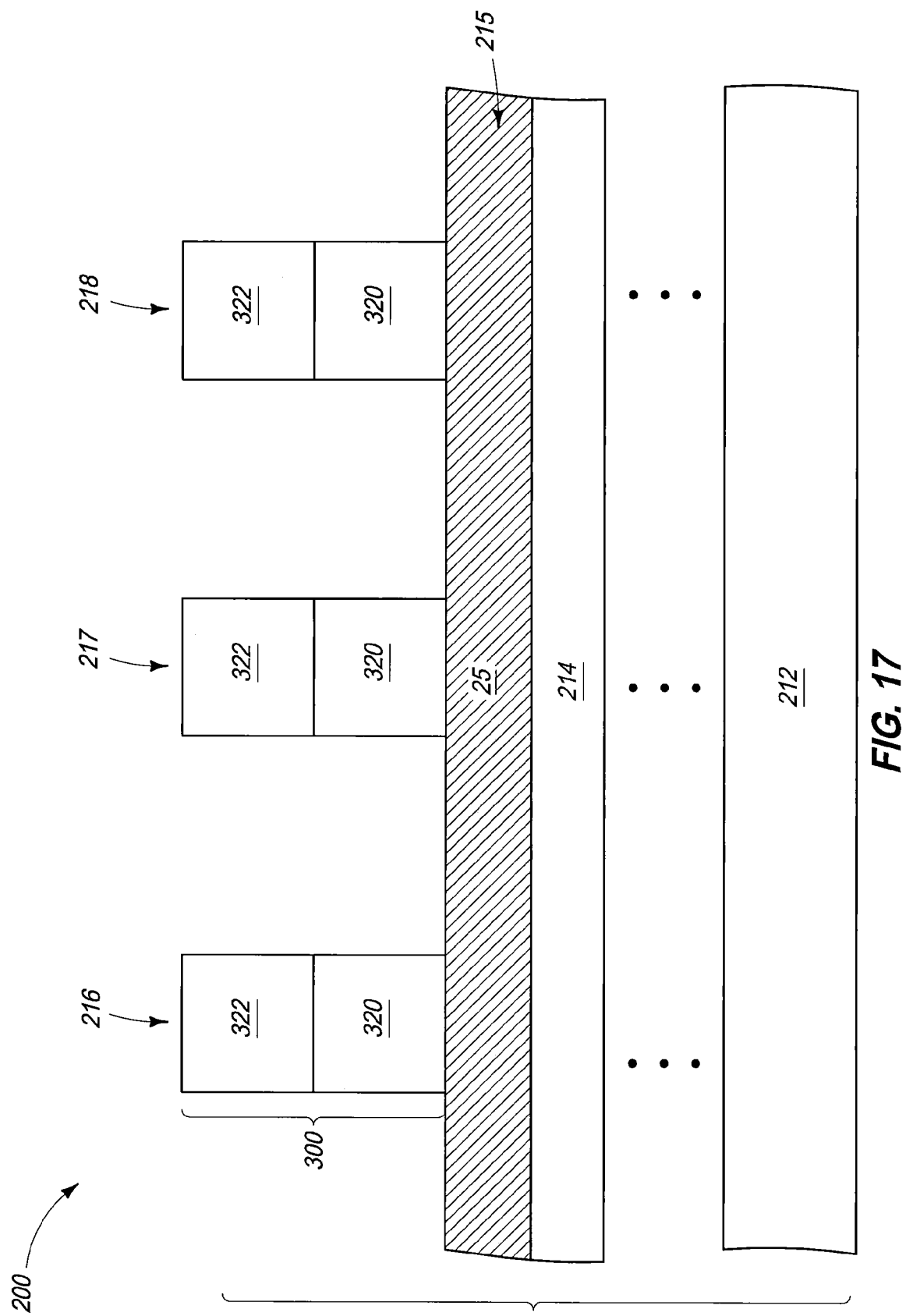

Referring to FIG. 17, the programmable material 300 is patterned into a plurality of spaced-apart memory cell features 216-218. Such patterning may comprise formation of a photolithographically-patterned mask (not shown), or any other suitable mask (for instance, a mask formed with pitch-multiplication methodologies), over programmable material 300, followed by a transfer of a pattern from the mask into material 300 with one or more suitable etches, and subsequent removal of the mask to leave the construction shown in FIG. 17.

Figure 18:
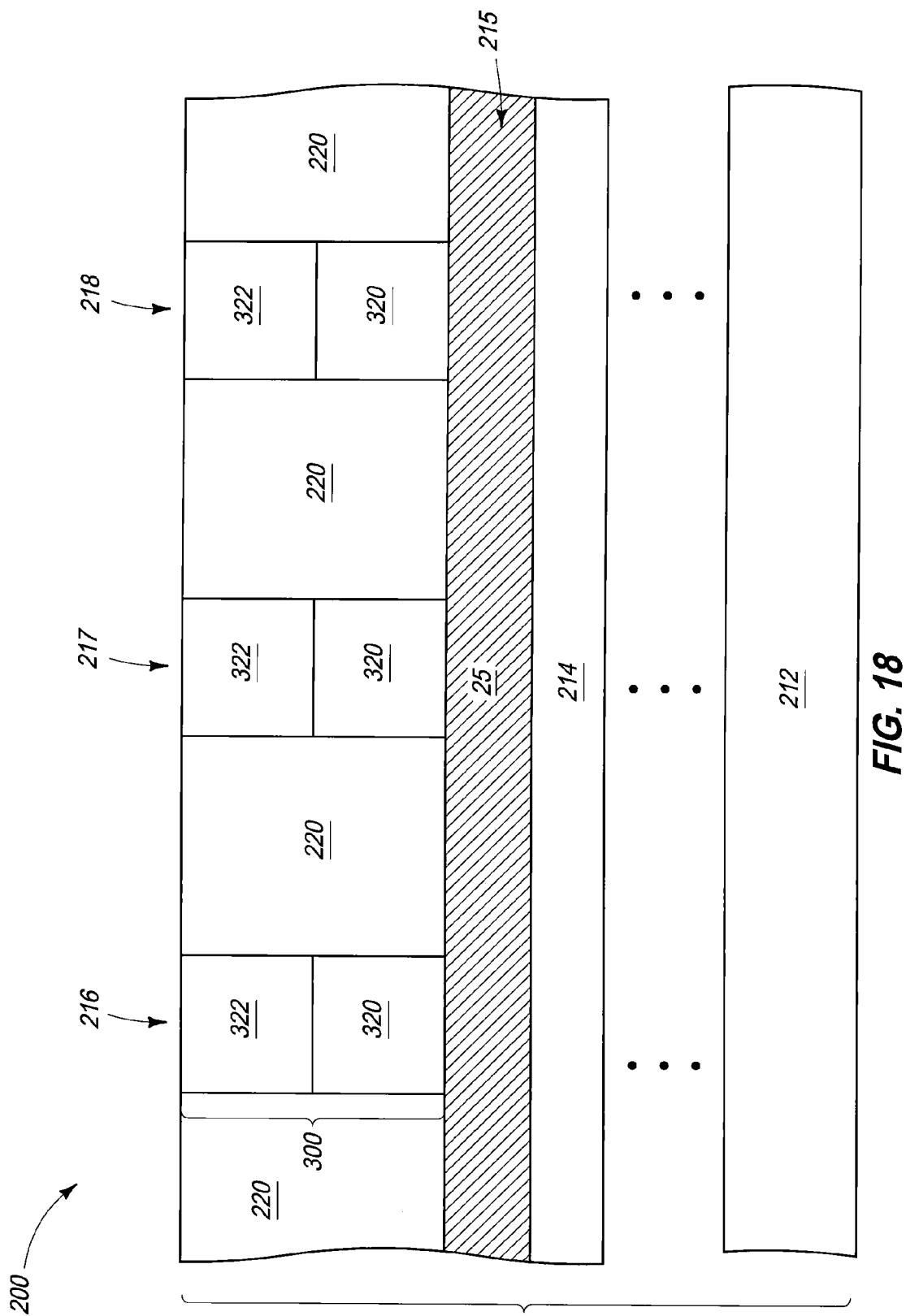

Referring to FIG. 18, electrically insulative material 220 is formed within the spaces between features 216-218. The electrically insulative material 220 may comprise any suitable composition or combination of compositions, such as, for example, one or more of silicon dioxide, silicon nitride, doped silicate glass, etc.

The electrically insulative material 220 may be formed in the shown configuration by initially forming the electrically insulative material over and between features 216-218, and then removing the electrically insulative from over the features with a suitable planarization methodology (for instance, chemical-mechanical polishing).

Figure 19:
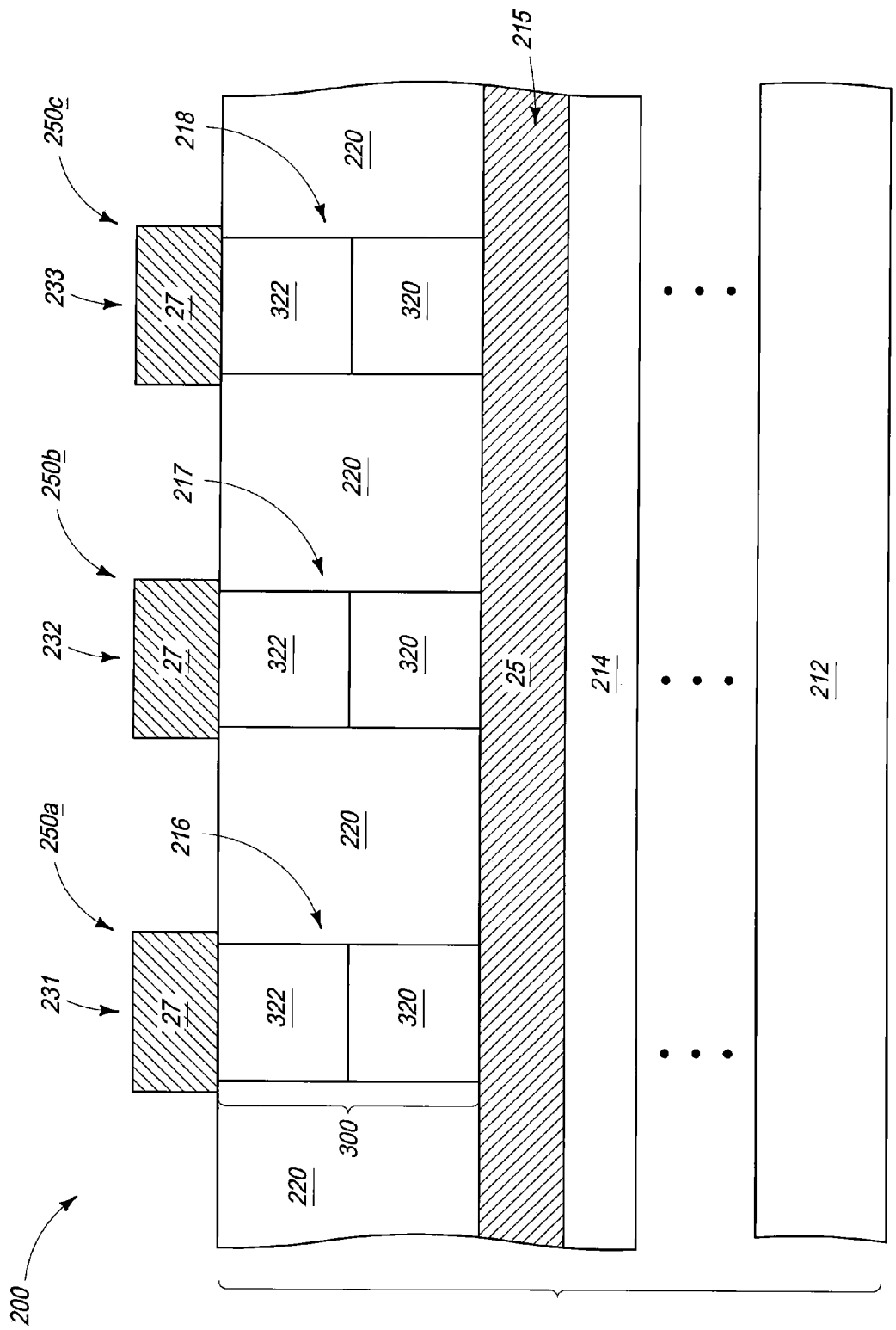

Referring to FIG. 19, electrode material 27 is formed over the features 216-218 of programmable material 300, and patterned to form a plurality of lines 231-233. The lines 231-233 extend along a direction orthogonal to the cross-section of FIG. 19, and specifically extend in and out of the page relative to the view of FIG. 19. Accordingly, the lines 231-233 of top electrode material 27 extend substantially orthogonally relative to the line 215 of the bottom electrode material 25.

The top electrode material 27 may be patterned into the lines 231-233 with any suitable processing, including, for example, utilization of a mask (not shown), one or more suitable etches to transfer a pattern from the mask into material 27, and subsequent removal of the mask to leave the construction shown in FIG. 19. In subsequent processing, electrically insulative material (not shown) may be formed over and between the lines 231-233.

In the shown embodiment of FIG. 19, the top electrode material 27 is formed directly against programmable material 300. In other embodiments, one or more barrier materials (not shown) of the type described above with reference to FIG. 4 may be formed between the top electrode material and the programmable material.

The construction of FIG. 19 may correspond to a portion of a memory array. Specifically, the line 215 may be representative of a first series of access lines that extend along a first direction, and the lines 231-233 may be representative of a second series of access lines that extend along a second direction, and which overlap the first series of access lines. Cross-point memory cells 250a-c (analogous to the cells discussed above with reference to FIG. 6) are formed at locations where the second series of access lines overlap the first series of access lines. Such cross-point memory cells having programmable material 300 directly between the access lines of the first series and the access lines of the second series.

The cross-point memory cells may have intrinsic pn diodes in a "SET" memory state, and may correspond to any of the memory cells described above with reference to FIGS. 4, 7, 9, and 11-14. The pn diode may be oriented with the p-type region as the upper region, or with the n-type region as the upper region. Thus, in some embodiments, the lower region 320 may be n-type in the "SET" memory state, and in other embodiments the upper region 322 may be n-type in the "SET" memory state.

The memory cells discussed above may be incorporated into memory arrays of electronic devices, and such devices may be incorporated into electronic systems. The electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell comprising:
   a programmable material having first and second regions which are compositionally different from one another;
   ions and/or ion-vacancies diffusible into said first region;
   wherein the programmable material has two distinguishable and interchangeable memory states, with one of the states being a "SET" state and the other being a "RESET" state; the "SET" state passing greater current than the "RESET" state when an electrical field is applied across the programmable material;
   wherein the first region is of a first conductivity type in the "SET" state and the second region is of a second conductivity type in the "SET" state, with the second conductivity type being opposite of the first conductivity type; and
   wherein the first conductive type of the first region is induced by a concentration of the ions and/or the ion vacancies in the first region.

2. The memory cell of claim 1 wherein:
   the first region comprises a composition containing oxygen in combination with one or more of praseodymium, barium, calcium, manganese, strontium, titanium, iron, cesium and lead; and
   the ions are oxygen-containing ions and/or the vacancies are vacancies of oxygen-containing ions.

3. The memory cell of claim 1 wherein the first region is electrically insulative in the "RESET" state.

4. The memory cell of claim 1 wherein the first region is of the second conductivity type in the "RESET" state.

5. The memory cell of claim 1 wherein the second conductivity type of the second region in the "SET" state is induced by a concentration of the ions and/or by a concentration of the ion vacancies in the second region.

6. The memory cell of claim 5 wherein the second region is electrically insulative in the "RESET" state.

7. The memory cell of claim 5 wherein the second region is of the first conductivity type in the "RESET" state.

8. The memory cell of claim 1 wherein the first and second regions are directly against one another.

9. The memory cell of claim 1 wherein the first and second regions are spaced from one another by a reservoir of the ions and/or of the ion vacancies.

10. The memory cell of claim 1 wherein the first and second regions are spaced from one another by a layer permeable to the ions and/or to the ion vacancies.

11. The memory cell of claim 1 wherein the first and second regions are of opposite conductivity type relative to one another in both the "SET" and "RESET" states, and thereby together comprise a first pn diode in the "SET" state and a second pn diode in the "RESET" state; the second pn diode being inverted relative to the first pn diode.

12. The memory cell of claim 1 wherein the second region is conductively-doped semiconductor material, and remains as a second conductivity-type region in the "SET" and "RESET" states.

* * * * *